(12) United States Patent
Okada

(10) Patent No.: US 7,960,040 B2
(45) Date of Patent: Jun. 14, 2011

(54) ORGANIC ELECTROLUMINESCENCE DEVICE

(75) Inventor: Hisashi Okada, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 1147 days.

(21) Appl. No.: 11/709,679

(22) Filed: Feb. 23, 2007

(65) Prior Publication Data

US 2007/0202356 A1 Aug. 30, 2007

(30) Foreign Application Priority Data

Feb. 28, 2006 (JP) ................................. 2006-053820

(51) Int. Cl.
*H01L 51/54* (2006.01)

(52) U.S. Cl. ........ 428/690; 428/917; 313/504; 313/506; 257/E51.044

(58) Field of Classification Search .................. None
See application file for complete search history.

(56) References Cited

U.S. PATENT DOCUMENTS

| 5,712,361 A | * | 1/1998 | Stern et al. | 528/86 |
| 6,600,175 B1 | * | 7/2003 | Baretz et al. | 257/100 |
| 2004/0238814 A1 | * | 12/2004 | Mizusaki et al. | 257/40 |

FOREIGN PATENT DOCUMENTS

JP 2003-77675 A 3/2003

OTHER PUBLICATIONS

Nicola Armaroli et al., "Supramolecular Photochemistry and Photophysics. A [3]-Catenand . . . [3]-Catenates", J. Am. Chem. Soc., vol. 116, pp. 5211-5217 (1994).*

G. Giro et al "Excimer-like electroluminescence from thin films of switchable supramolecular anthracene-based rotaxanes", Synthetic Metals, vol. 122, pp. 27-29 (2001).*

* cited by examiner

*Primary Examiner* — Marie R. Yamnitzky

(74) *Attorney, Agent, or Firm* — Birch, Stewart, Kolasch & Birch, LLP

(57) ABSTRACT

An organic electroluminescence device comprising at least an organic layer between a pair of electrodes, wherein the organic electroluminescence device further includes at least an interlocked compound. An organic electroluminescence device exhibiting a high light emission efficiency and excellent driving durability is provided.

6 Claims, No Drawings

ORGANIC ELECTROLUMINESCENCE DEVICE

CROSS-REFERENCE TO RELATED APPLICATION

This application claims priority under 35 USC 119 from Japanese Patent Application No. 2006-53820, the disclosure of which is incorporated by reference herein.

BACKGROUND OF THE INVENTION

1. Field of the Present Invention

The present invention relates to an organic electroluminescence device.

2. Description of the Related Art

Research and development concerning various display devices are being actively carried out, and, among these, an organic electroluminescence device (hereinafter also referred as an "organic EL device") is attracting attention as a promising display device as it can provide a light emission of a high luminance at a low voltage.

In recent development of the organic EL devices, various research is being carried out for reduction in driving voltage, improvement in durability, and improvement in external quantum yield.

As a technology for enabling light emission at a low voltage, utilization of a copper phthalocyanine or an amine compound as a hole injection material has been reported. However, devices utilizing known hole injection materials are associated with disadvantages of a decrease in luminance and generation of a dark spot (non-light-emitting portion) in the case of prolonged light emission or prolonged storage at a high temperature.

A device containing a phosphorescence emitting metal complex such as a trisphenylpyridine iridium complex disclosed in WO 00/070655 or an octaethylporphyrin platinum complex disclosed in U.S. Pat. No. 6,303,238B1 or 6,653,564B1 shows a high external quantum efficiency and is attracting attention.

However, devices containing such a phosphorescence emitting material are unsatisfactory in durability, and further improvement is desired.

On the other hand, mass production methods for a panel include a vacuum deposition method utilizing a low molecular material, an ink jet method utilizing a high molecular material, and a printing method, but a wet coating method is being investigated as a method capable of easily realizing a large area device.

However, because many of the metal complexes such as described above, have a strong intermolecular interaction and form a molecular associate, they have an extremely low solubility in a solvent, and a uniformly dissolved wet coating liquid is difficult to prepare. Also, because of the low solubility, they are difficult to contain at a high concentration in a film, and are therefore disadvantageous with respect to durability of the device.

Moreover, because such metal complexes form a molecular associate even in the organic EL device and exhibit a light emission of a different wavelength derived from such associate, the color of light emission becomes impure and a light emission of a high saturation is difficult to obtain.

On the other hand, JP-A No. 2003-77675 discloses a device prepared by wet coating utilizing a polymer bonded with a metal complex such as an iridium complex, but such a device has some disadvantages such as low light emission efficiency, poor driving durability and the like, and further improvement is therefore desired.

SUMMARY OF THE INVENTION

The present invention has been made in view of the above circumstances and provides an organic electroluminescence device comprising at least an organic layer between a pair of electrodes, wherein the organic electroluminescence device further includes at least an interlocked compound.

DETAILED DESCRIPTION OF THE INVENTION

An object of the present invention is to provide an organic electroluminescence device exhibiting high light emission efficiency and excellent driving durability. Another object is to provide an organic electroluminescence device suitable for a wet coating process.

The present invention has been made in view of the above circumstances, and these objects are attained by an organic electroluminescence device including at least an organic layer between a pair of electrodes, wherein the organic electroluminescence device includes at least an interlocked compound.

Preferably, a layer containing the interlocked compound is formed by a wet coating process.

Preferably, a layer containing the interlocked compound is at least one of a hole injection layer or a light emission layer. More preferably, a layer containing the interlocked compound is a hole injection layer and a light emission layer.

Preferably, the interlocked compound is a compound represented by formula (I), (II) or (III).

Preferably, the interlocked compound is a compound represented by formula (I-A) among compounds represented by formula (I).

Preferably, the interlocked compound is a compound represented by formula (II-A) among compounds represented by formula (II).

Preferably, the interlocked compound is a compound represented by formula (III-A) among compounds represented by formula (III).

The organic electroluminescence device of the present invention will be described in detail below.

The organic electroluminescence device of the present invention includes a cathode electrode and an anode electrode on a substrate, and also includes, between the electrodes, an organic compound layer including an organic light emission layer (hereinafter also referred to simply as a "light emission layer" in some cases). Due to the nature of an electroluminescence device, at least either one of the anode and the cathode is preferably transparent.

The organic compound layer in the present invention may be formed by a single layer or laminated layers. In the case of a laminated structure, a structure in which a hole transport layer, a light emission layer and an electron transport layer are laminated in order from the anode side is preferred. Also, a charge blocking layer or the like may be provided between the hole transport layer and the light emission layer, or between the light emission layer and the electron transport layer. Also, a hole injection layer may be provided between the anode and the hole transport layer, and an electron injection layer may be provided between the cathode and the electron transport layer. Further, each layer may be divided into plural secondary layers.

1. Explanation of Interlocked Compound

Next, an interlocked compound to be employed in the organic electroluminescence device of the present invention will be explained in detail.

The interlocked compound to be employed in the present invention is a compound in which molecular rings are connected like a chain, and includes a catenane compound and a rotaxane compound. The catenane compounds and rotaxane compounds are described in "*Kikan Kagaku Sosetsu* (No. 31), Chobunshi wo Mezasu kagaku (Chemistry toward Supramolecules)", edited by the Japan Society of Chemistry (pp. 206-216), and "Kinousei Chobunshi (Functional Supramolecules)", CMC Shuppan (pp. 38-59).

The interlocked compound to be employed in the present invention may have one or plural interlocked parts (molecular ring structures connected within the molecule). Typical structures of the interlocked compound include structures represented by the following type I, but it may have a structure in which rings are connected three-dimensionally (for example a structure represented by type II or type III).

Type I

Type II

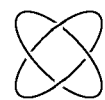

Type III

The interlocked compound may be an organic molecule, a non-metal complex (such as a boron complex), or a metal complex. In case of a metal complex, the metal is not particularly restricted, but is preferably an alkali metal, an alkali earth metal, Al, Ga, a transition metal or a rare earth metal. Specific examples of the metal include Li, Na, Be, Mg, Ba, Al, Ca, Fe, Co, Ni, Cu, Zn, Ga, Ru, Rh, Pd, Ag, W, Re, Os, Ir, Pt, Au, Eu, Tb and Yb. Also, the complex may be a single-nucleus complex or plural-nucleus complex. In case of a plural-nucleus complex, plural metal atoms may be the same or different from each other.

Also the interlocked compound to be employed in the present invention may be of a low molecular weight (molecular weight being preferably from 350 to 3,000, more preferably from 400 to 2,500, and further preferably from 450 to 2,000), or of a high molecular weight (molecular weight as a weight-average molecular weight being preferably from 3,000 to 1,000,000, more preferably from 4,000 to 500,000, and further preferably from 5,000 to 100,000).

The interlocked compound to be employed in the present invention is preferably a compound represented by the following formula (I), (II) or (III).

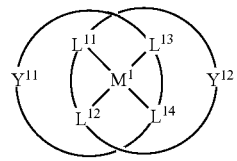

Formula (I)

In the formula (I), $M^1$ represents a metal; $L^{11}$, $L^{12}$, $L^{13}$ and $L^{14}$ each independently represent an atomic group coordinated to the metal; and $Y^{11}$ and $Y^{12}$ each independently represent a linking group.

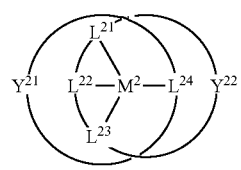

Formula (II)

In the formula (II), $M^2$ represents a metal; $L^{21}$, $L^{22}$, $L^{23}$ and $L^{24}$ each independently represent an atomic group coordinated to the metal; and $Y^{21}$ and $Y^{22}$ each independently represent a linking group.

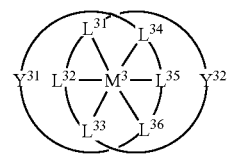

Formula (III)

In the formula (III), $M^3$ represents a metal; $L^{31}$, $L^{32}$, $L^{33}$, $L^{34}$, $L^{35}$ and $L^{36}$ each independently represent an atomic group coordinated to the metal; and $Y^{31}$ and $Y^{32}$ each independently represent a linking group.

The compound represented by the formula (I) will be explained in detail.

The metal represented by $M^1$ is not particularly restricted, but is preferably from 0-valent to tetravalent, and more preferably from univalent to trivalent. Specific examples of the metal represented by $M^1$ include Be, Mg, Ba, Al, Ca, Fe, Co, Ni, Cu, Zn, Ga, Ru, Rh, Pd, Ag, W, Re, Os, Ir, Pt, Au, Eu, Tb and Yb. In the case that the compound represented by the formula (I) is used as a hole transporting material (a hole injection material, a hole transport material, an electron blocking material, or a host material of the light emission layer), the metal is preferably Cu, Ru, Rh, Pd or Ir, more preferably Cu or Ir, and particularly preferably Cu.

In the case that the compound represented by the formula (I) is used as an electron transporting material (an electron injection material, an electron transport material, a hole blocking material, or a host material of the light emission layer), the metal is preferably Be, Mg, Al, Zn, Ga, Ru, Rh, Pd or Pt, more preferably Be, Al, Zn, Pd or Pt, and particularly preferably Be, Zn, Pd or Pt. Also, in the case that the compound represented by the formula (I) is used as a light emitting material, the metal is preferably Cu, Ru, Rh, Pd, Re, Ir or Pt, more preferably Ru, Rh, Pd, Re or Pt, and particularly preferably Pt.

An atomic group represented by each of $L^{11}$, $L^{12}$, $L^{13}$ and $L^{14}$ and coordinated to $M^1$ (bond formed by coordination including a coordination bond, a covalent bone, and an ionic bond) is not particularly restricted, and examples thereof include an atomic group coordinated by a carbon atom, an atomic group coordinated by a nitrogen atom, an atomic group coordinated by an oxygen atom, an atomic group coordinated by a sulfur atom, and an atomic group coordinated by a phosphorus atom.

Examples of the atomic group coordinated by a carbon atom include an aromatic cyclic hydrocarbon group (preferably having 6 to 30 carbon atoms, more preferably having 6 to 20 carbon atoms and particularly preferably having 6 to 14 carbon atoms, such as benzene, naphthalene, anthracene, phenanthrene, pentacene, pyrene, perylene, triphenylene or the like), an unsaturated hydrocarbon group (preferably having 2 to 30 carbon atoms, more preferably having 2 to 20 carbon atoms and particularly preferably having 2 to 14 carbon atoms, such as vinyl, phenylacetylene or the like), a heterocyclic group (preferably having 1 to 30 carbon atoms, more preferably having 1 to 20 carbon atoms and particularly preferably having 1 to 10 carbon atoms, such as furan, thiopehene, pyrrole, imidazole, pyrazole, thiazole, oxazole, triazole, pyridine, pyrazine, pyrimidine, pyridazine, triazine or the like), a condensed ring group containing these (such as indole, benzofuran, benzothiophene, benzimidazole, benzoxazole, benzothiazole, imidazopyridine, purine, quinoline, quinoxaline, phthalazine, phenanthroline, carbazole, tribenzoazepine, indolenine, pyrrolotriazole, pyrrolopyrrole, pyrazolotriazole, purine or the like), and tautomeric isomers thereof. These groups may further have a substituent. Examples of the substituent include those explained for $R^{a1}$ and $R^{a2}$ in a formula (I-A) to be explained later.

Examples of the atomic group coordinated by a nitrogen atom include an amino group (an alkylamino group (preferably having 1 to 30 carbon atoms, more preferably 2 to 20 carbon atoms and particularly preferably 2 to 10 carbon atoms, such as methylamino, dimethylamino or the like), an arylamino group (preferably having 6 to 30 carbon atoms, more preferably 6 to 20 carbon atoms and particularly preferably 6 to 14 carbon atoms, such as phenylamino, naphthylamino, diphenylamino or the like), a heterocyclic amino group (preferably having 1 to 30 carbon atoms, more preferably 1 to 20 carbon atoms and particularly preferably 1 to 10 carbon atoms, such as aminofuran, aminothiophene, aminopyrrole, aminoimidazole, aminopyrazole, aminothiazole, aminooxazole, aminotriazole, aminopyridine, aminopyrazine, aminopyrimidine, aminopyridazine, aminotriazine or the like), and a condensed ring group containing these (such as aminoindole, aminobenzofuran, aminobenzothiophene, aminobenzimidazole, aminobenzoxazole, aminobenzothiazole, aminoimidazopyridine, aminopurine, aminoquinoline, aminoquinoxaline, aminophthalazine, aminophenanthroline, aminocarbazole, aminotribenzoazepine, aminoindolenine or the like), and tautomeric isomers thereof), an acylamino group (preferably having 2 to 30 carbon atoms, more preferably 2 to 20 carbon atoms and particularly preferably 2 to 10 carbon atoms, such as acetylamino, benzoylamino or the like), an alkoxycarbonylamino group (preferably having 2 to 30 carbon atoms, more preferably 2 to 20 carbon atoms and particularly preferably 2 to 12 carbon atoms, such as methoxycarbonylamino or the like), an aryloxycarbonylamino group (preferably having 7 to 30 carbon atoms, more preferably 7 to 20 carbon atoms and particularly preferably 7 to 12 carbon atoms, such as phenyloxycarbonylamino or the like), a sulfonylamino group (preferably having 1 to 30 carbon atoms, more preferably 1 to 20 carbon atoms and particularly preferably 1 to 12 carbon atoms, such as methanesulfonylamino, benzenesulfonylamino, tolylsulfonylamino or the like), a nitrile group (preferably having 1 to 30 carbon atoms, more preferably 1 to 20 carbon atoms and particularly preferably 1 to 12 carbon atoms, such as cyanide, acetonitrile, benzonitrile or the like), a nitrogen-containing heterocyclic group (preferably having 1 to 30 carbon atoms, more preferably 1 to 20 carbon atoms and particularly preferably 1 to 10 carbon atoms, such as pyrrole, imidazole, pyrazole, thiazole, oxazole, triazole, pyridine, pyrazine, pyrimidine, pyridazine, triazine or the like), a condensed ring group containing these (such as indole, benzimidazole, benzoxazole, benzothiazole, imidazopyridine, purine, quinoline, quinoxaline, phthalazine, phenanthroline, carbazole, tribenzoazepine, indolenine, pyrrolotriazole, pyrrolopyrrole, pyrazolotriazole or purine), and tautomeric isomers thereof. These groups may further have a substituent. Examples of the substituent include those explained for $R^{a1}$ and $R^{a2}$ in a formula (I-A) to be explained later.

Examples of the atomic group coordinated by an oxygen atom include an alkoxy group (preferably having 1 to 30 carbon atoms, more preferably 1 to 20 carbon atoms and particularly preferably 1 to 10 carbon atoms, such as methoxy, ethoxy, butoxy, 2-ethylhexyloxy, cyclohexyloxy or the like), an alkenyloxy group (preferably having 2 to 30 carbon atoms, more preferably 2 to 20 carbon atoms and particularly preferably 2 to 10 carbon atoms, such as vinyloxy or the like), an aryloxy group (preferably having 6 to 40 carbon atoms, more preferably 6 to 30 carbon atoms and particularly preferably 6 to 20 carbon atoms, such as phenyloxy, 1-naphthyloxy, 2-naphthyloxy, 2-biphenyloxy, 3-biphenyloxy, 4-biphenyloxy, 2,6-diphenylphenyloxy or the like), a heterocyclicoxy group (preferably having 1 to 30 carbon atoms, more preferably 1 to 20 carbon atoms and particularly preferably 1 to 12 carbon atoms, such as pyridyloxy, purazyloxy, pyrimidyloxy, quinolyloxy, furyloxy, thienyloxy, benzofuranoxy, benzothiophenoxy or the like), an acyloxy group (preferably having 2 to 30 carbon atoms, more preferably 2 to 20 carbon atoms and particularly preferably 2 to 10 carbon atoms, such as acetoxy, benzoyloxy or the like), a silyloxy group (preferably having 3 to 40 carbon atoms, more preferably 3 to 30 carbon atoms and particularly preferably 3 to 24 carbon atoms, such as trimethylsilyloxy, triphenylsilyloxy, dimethylphenyloxy or the like), a carbonyl group (such as a ketone group, an ester group, an amide group or the like), an ether group (such as a dialkyl ether group, a diaryl ether group, a furyl group or the like) and the like. These groups may further have a substituent. Examples of the substituent include those explained for $R^{a1}$ and $R^{a2}$ in a formula (I-A) to be explained later.

Examples of the atomic group coordinated by a sulfur atom include an alkylthio group (preferably having 1 to 30 carbon atoms, more preferably 1 to 20 carbon atoms and particularly preferably 1 to 12 carbon atoms, such as methylthio, ethylthio or the like), an arylthio group (preferably having 6 to 30 carbon atoms, more preferably 6 to 20 carbon atoms and particularly preferably 6 to 12 carbon atoms, such as phenylthio, naphthylthio or the like), a heterocyclic thio group (preferably having 1 to 30 carbon atoms, more preferably 1 to 20 carbon atoms and particularly preferably 1 to 12 carbon atoms, such as pyridylthio, 2-benzimidazolylthio, 2-benzoxazolylthio, or 2-benzthiazolylthio), a thiocarbonyl group (such as a thioketone group, a thioester group or the like), a thioether group (such as a dialkyl thioether group, a diaryl thioether group, a thiofuryl group or the like) and the like. These groups may further have a substituent. Examples of the substituent include those explained for $R^{a1}$ and $R^{a2}$ in a formula (I-A) to be explained later.

Examples of the atomic group coordinated by a phosphorus atom include a dialkylphosphino group (preferably having 2 to 30 carbon atoms, more preferably 2 to 20 carbon atoms and particularly preferably 2 to 12 carbon atoms, such as dimethylphosphino, diethylphosphino or the like), a diarylphosphino group (preferably having 12 to 50 carbon atoms, more preferably 12 to 40 carbon atoms and particularly preferably 12 to 30 carbon atoms, such as diphenylphosphino or the like), a trialkylphosphine group (preferably having 3 to 30 carbon atoms, more preferably 3 to 20 carbon atoms and particularly preferably 3 to 12 carbon atoms, such as trimethylphosphine, triethylphosphine, tributylphosphine or the like), a triarylphosphine group (preferably having 18 to 50 carbon atoms, more preferably 18 to 40 carbon atoms and particularly preferably 18 to 30 carbon atoms, such as triphenylphosphine or the like), a phosphinine group and the like. These groups may further have a substituent. Examples of the substituent include those explained for $R^{a1}$ and $R^{a2}$ in a formula (I-A) to be explained later.

The atomic group represented by $L^{11}$, $L^{12}$, $L^{13}$ and $L^{14}$ and coordinated to $M^1$ is preferably an atomic group coordinated by a carbon atom, an atomic group coordinated by a nitrogen atom, an atomic group coordinated by an oxygen atom, or an atomic group coordinated by a phosphorus atom, more preferably an atomic group coordinated by a carbon atom, an atomic group coordinated by a nitrogen atom, or an atomic group coordinated by an oxygen atom, further preferably an aryl group coordinated by a carbon atom, a heteroaryl group coordinated by a carbon atom, a heteroaryl group coordinated by a nitrogen atom, an alkenyloxy group coordinated by an oxygen atom, an aryloxy group coordinated by an oxygen atom, a silyloxy group coordinated by an oxygen atom, a carbonyl group coordinated by an oxygen atom, a carboxyl group coordinated by an oxygen atom, an acyl group coordinated by an oxygen atom, or a heteroaryloxy group coordinated by an oxygen atom, and particularly preferably an aryl group coordinated by a carbon atom, a heteroaryl group coordinated by a carbon atom, or a heteroaryl group coordinated by a nitrogen atom.

$Y^{11}$ and $Y^{12}$ each independently represent a linking group. The linking group is not particularly restricted, and examples thereof include an alkylene group (such as a methylene group, a dimethylmethylene group, a diisopropylmethylene group, a diphenylmethylene group, an ethylene group, a tetramethylethylene group, a trimethylene group or the like), an alkenylene group (such as a vinylene group, a dimethylvinylene group or the like), an alkynylene group (such as an ethynylene group or the like), an arylene group (such as a phenylene group, a naphthylene group, an anthracenylene group or the like), a heteroarylene group (such as a pyridylene group, a pyrazylene group, a quinolylene group or the like), an oxygen linking group, a sulfur linking group, a nitrogen linking group (such as a methylamino linking group, a phenylamino linking group, a t-butylamino linking group or the like), a silicon linking group (such as a dimethylsilyl linking group, a diphenylsilyl linking group or the like), a linking group formed by a combination thereof (such as an ethyleneoxy group or the like) and the like.

The linking group represented by $Y^{11}$ and $Y^{12}$ is preferably an alkylene group, an alkenylene group, an arylene group, a heteroarylene group, an oxygen linking group, a sulfur linking group, a nitrogen linking group, a silicon linking group or a linking group formed by a combination thereof, and more preferably a linking group formed by a combination of an alkylene group and an oxygen linking group, a linking group formed by a combination of an arylene group, an alkylene group and an oxygen linking group, or a linking group formed by a combination of a heteroarylene group, an alkylene group and an oxygen linking group.

$Y^{11}$ and $Y^{12}$ may further have a substituent, and examples thereof include those explained for $R^{a1}$ and $R^{a2}$ in a formula (I-A) to be explained later.

Specific examples of the linking group represented by $Y^{11}$ or $Y^{12}$ include those shown below.

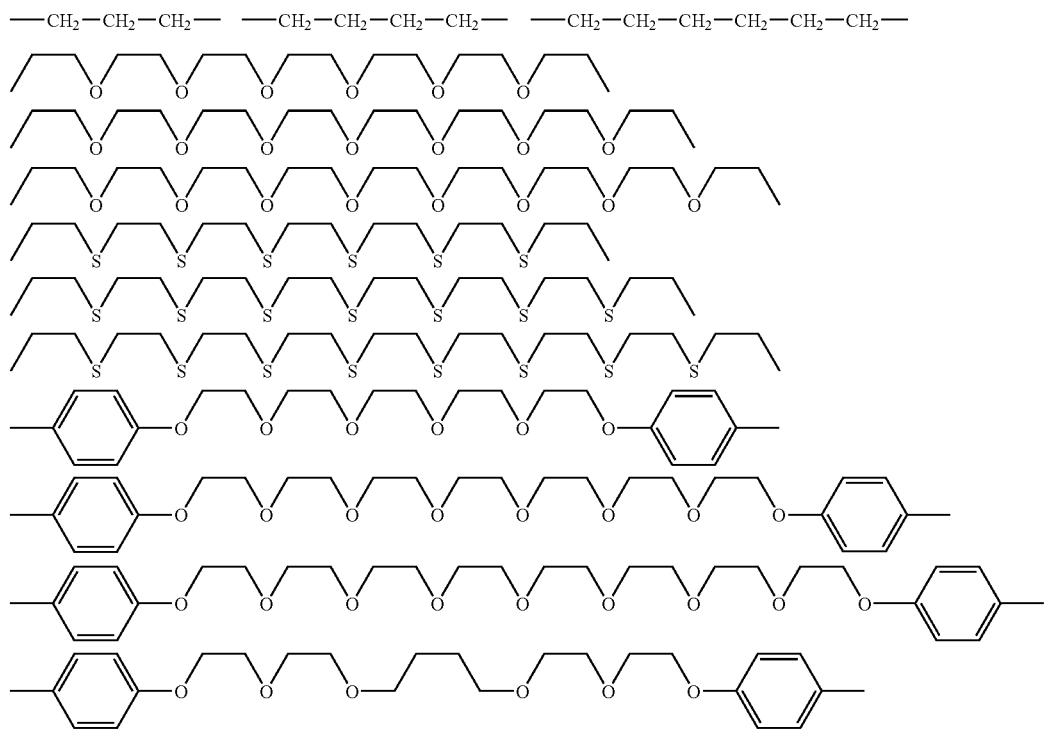

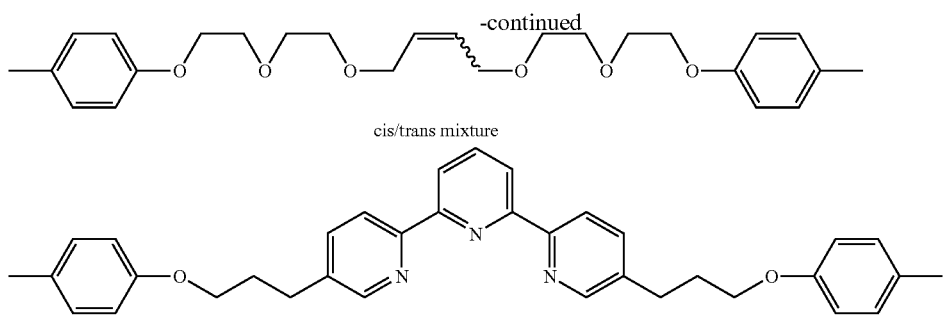

cis/trans mixture

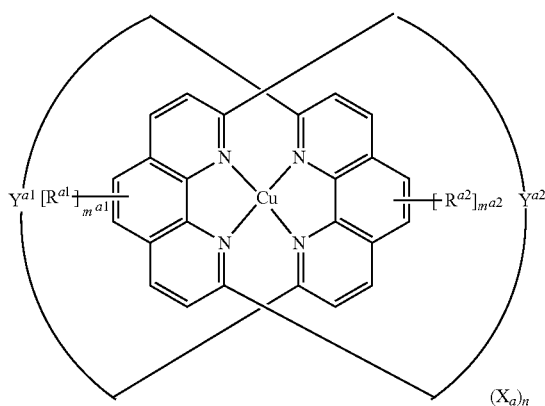

Each of an $M^1$-$L^{11}$ bond, an $M^1$-$L^{12}$ bond, an $M^1$-$L^{13}$ bond, and an $M^1$-$L^{14}$ bond may be a covalent bond, a coordination bond or an ionic bond.

Among the compounds represented by the formula (I), preferable ones are those represented by a following formula (I-A).

Formula (I-A)

In the formula (I-A), $Y^{a1}$ and $Y^{a2}$ each independently represent a linking group; $R^{a1}$ and $R^{a2}$ each independently represent a substituent; $m^{a1}$ and $m^{a2}$ each independently represents an integer from 0 to 6; Xa represents an anion; and n represents a number equal to or larger than 0, determined in such a manner that the compound represented by the formula (I-A) becomes a neutral molecule.

The linking groups represented by $Y^{a1}$ and $Y^{a2}$ have the same meaning as $Y^{11}$ and $Y^{12}$ in the formula (I), and have similar preferable ranges.

Examples of the substituent represented by $R^{a1}$ and $R^{a2}$ include an alkyl group (preferably having 1 to 30 carbon atoms, more preferably 1 to 20 carbon atoms, and particularly preferably 1 to 10 carbon atoms, such as methyl, ethyl, n-propyl, iso-propyl, n-butyl, iso-butyl, tert-butyl, n-octyl, n-decyl, n-hexadecyl, cyclopropyl, cyclopentyl, cyclohexyl or the like), an alkenyl group (preferably having 2 to 30 carbon atoms, more preferably 2 to 20 carbon atoms, and particularly preferably 2 to 10 carbon atoms, such as vinyl, allyl, 2-butenyl, 3-pentenyl or the like), an alkynyl group (preferably having 2 to 30 carbon atoms, more preferably 2 to 20 carbon atoms, and particularly preferably 2 to 10 carbon atoms, such as ethynyl, propalgyl, 3-pentynyl or the like), an aryl group (preferably having 6 to 30 carbon atoms, more preferably 6 to 20 carbon atoms, and particularly preferably 6 to 14 carbon atoms, such as phenyl, p-methylphenyl, naphthyl, anthranyl, biphenyl or the like), an amino group (preferably having 0 to 40 carbon atoms, more preferably 0 to 30 carbon atoms, and particularly preferably 0 to 20 carbon atoms, such as amino, methylamino, dimethylamino, diethylamino, dibenzylamino, diphenylamino, ditolylamino or the like), an alkoxy group (preferably having 1 to 30 carbon atoms, more preferably 1 to 20 carbon atoms, and particularly preferably 1 to 10 carbon atoms, such as methoxy, ethoxy, butoxy, 2-ethylhexyloxy or the like), an aryloxy group (preferably having 6 to 30 carbon atoms, more preferably 6 to 20 carbon atoms, and particularly preferably 6 to 14 carbon atoms, such as phenyloxy, 1-naphthyloxy, 2-naphthyloxy, biphenyloxy or the like), a heterocyclic oxy group (preferably having 1 to 30 carbon atoms, more preferably 1 to 20 carbon atoms, and particularly preferably 1 to 12 carbon atoms, such as furyloxy, thienyloxy, pyridyloxy, pyrazyloxy, pyrimidyloxy, quinolyloxy or the like), an acyl group (preferably having 1 to 30 carbon atoms, more preferably 1 to 20 carbon atoms, and particularly preferably 1 to 12 carbon atoms, such as acetyl, benzoyl, formyl, pivaloyl or the like), an alkoxycarbonyl group (preferably having 2 to 30 carbon atoms, more preferably 2 to 20 carbon atoms, and particularly preferably 2 to 12 carbon atoms, such as methoxycarbonyl, ethoxycarbonyl or the like), an aryloxycarbonyl group (preferably having 7 to 30 carbon atoms, more preferably 7 to 20 carbon atoms, and particularly preferably 7 to 14 carbon atoms, such as phenyloxycarbonyl or the like), an acyloxy group (preferably having 2 to 30 carbon atoms, more preferably 2 to 20 carbon atoms, and particularly preferably 2 to 10 carbon atoms, such as acetoxy, benzoyloxy or the like), an acylamino group (preferably having 2 to 30 carbon atoms, more preferably 2 to 20 carbon atoms, and particularly preferably 2 to 10 carbon atoms, such as acetylamino, benzoylamino or the like), an alkoxycarbonylamino group (preferably having 2 to 30 carbon atoms, more preferably 2 to 20 carbon atoms, and particularly preferably 2 to 12 carbon atoms, such as methoxycarbonylamino or the like), an aryloxycarbonylamino group (preferably having 7 to 30 carbon atoms, more preferably 7 to 20 carbon atoms, and particularly preferably 7 to 12 carbon atoms, such as phenyloxycarbonylamino), a sulfonylamino group (preferably having 1 to 30 carbon atoms, more preferably 1 to 20 carbon atoms, and particularly preferably 1 to 12 carbon atoms, such as methanesulfonylamino, benzenesulfonylamino or the like), a sulfamoyl group (preferably having 0 to 30 carbon atoms, more preferably 0 to 20 carbon atoms, and particularly preferably 0 to 12 carbon atoms, such as sulfamoyl, methylsulfamoyl, dimethylsulfamoyl, phenylsulfamoyl or the like), a carbamoyl group (preferably having 1 to 30 carbon atoms, more preferably 1 to 20 carbon atoms, and particularly preferably 1 to 12 carbon atoms, such as carbamoyl, methylcarbamoyl, diethylcarbamoyl, phenylcarbamoyl or the like), an alkylthio group (preferably having 1 to 30 carbon atoms, more preferably 1 to 20 carbon atoms, and particularly preferably 1 to 12 carbon atoms, such as methylthio, ethylthio or the like), an arylthio group (preferably having 6 to 30 carbon atoms, more preferably 6 to 20 carbon atoms, and particularly preferably 6 to 12 carbon atoms, such as phenylthio or the like), a heterocyclic thio group (preferably having 1 to 30 carbon atoms, more preferably 1 to 20 carbon atoms, and particularly preferably 1 to 12 carbon atoms, such as pyridylthio, 2-benzimidazolylthio, 2-benzoxazolylthio, 2-benzothiazolylthio or the like), a sulfonyl group (preferably having 1 to 30 carbon atoms, more preferably 1 to 20 carbon atoms, and particularly preferably 1 to 12 carbon atoms, such as mesyl, tosyl or the like), a sulfinyl group (preferably having 1 to 30 carbon atoms, more preferably 1 to 20 carbon atoms, and particularly preferably 1 to 12 carbon atoms, such as methanesulfinyl, benzenesulfinyl or the like), an ureido group (preferably having 1 to 30 carbon atoms, more preferably 1 to 20 carbon atoms, and particularly preferably 1 to 12 carbon atoms, such as ureido, methylureido, phenylureido or the like), a phosphoric amido group (preferably having 1 to 30 carbon atoms, more preferably 1 to 20 carbon atoms, and particularly preferably 1 to 12 carbon atoms, such as diethylphosphoric amido, phenylphosphoric amido or the like), a hydroxyl group, a mercapto group, a halogen atom (such as a fluorine atom, a chlorine atom, a bromine atom or an iodine atom), a cyano group, a sulfo group, a carboxyl group, a nitro group, a hydroxamic acid group, a sulfino group, a hydrazino group, an imino group, a heterocyclic group (preferably having 1 to 30 carbon atoms, more preferably 1 to 12 carbon atoms, and including a nitrogen atom, an oxygen atom, or a sulfur atom as a heteroatom; specific examples including imidazolyl, pyridyl, quinolyl, furyl, thienyl, piperidyl, morpholino, benzoxazolyl, benzimidazolyl, benzothiazolyl, carbazolyl, azepinyl or the like), a silyl group (preferably having 3 to 40 carbon atoms, more preferably 3 to 30 carbon atoms, and particularly preferably 3 to 24 carbon atoms, such as trimethylsilyl, triphenylsilyl, di-tert-butylmethylsilyl or the like), and a silyloxy group (preferably having 3 to 40 carbon atoms, more preferably 3 to 30 carbon atoms, and particularly preferably 3 to 24 carbon atoms, such as trimethylsilyloxy, triphenylsilyloxy or the like) and the like. Such substituent may be further substituted.

Preferably, the substituent is an alkyl group, an aryl group, an aromatic heterocyclic group, a halogen atom, an alkoxy group, an aryloxy group, a heterocyclic oxy group, a cyano group, or an amino group, more preferably is an alkyl group, an aryl group, an aromatic heterocyclic group, a fluorine atom, an alkoxy group, an aryloxy group, a heterocyclic oxy group, a cyano group or an amino group, further preferably is an alkyl group having 1 to 10 carbon atoms, an aryl group having 6 to 12 carbon atoms, an aromatic heterocyclic group having 1 to 12 carbon atoms, a fluorine atom, an alkoxy group having 1 to 10 carbon atoms, an aryloxy group having 6 to 14 carbon atoms, an aromatic heterocyclic oxy group having 1 to 12 carbon atoms, a cyano group or an amino group having 0 to 20 carbon atoms, and particularly preferably is an alkyl group having 1 to 10 carbon atoms, an aryl group having 6 to 12 carbon atoms, an aromatic nitrogen-containing heterocyclic group having 1 to 12 carbon atoms, a fluorine atom, an alkoxy group having 1 to 10 carbon atoms, an aryloxy group having 6 to 14 carbon atoms, an aromatic heterocyclic oxy group having 1 to 12 carbon atoms, a cyano group or an amino group having 2 to 20 carbon atoms.

$m^{a1}$ and $m^{a2}$ each represent an integer from 0 to 6, preferably from 0 to 2, more preferably 0 or 1 and further preferably 0. In the case that $m^{a1}$ or $m^{a2}$ represents an integer of from 2 to 6, plural $R^{a1}$s or $R^{a2}$s may be the same or different each other.

The anion represented by Xa may be organic or inorganic, and examples thereof include a halide ion (such as $Cl^-$, $Br^-$, $I^-$ or the like), a sulfonate ion (such as trifluoromethanesulfonate, p-toluenesulfonate, benzenesulfonate, p-chlorobenzenesulfonate or the like), a sulfate ion (such as methylsulfate, or ethylsulfate), a perchlorate ion, a borate ion (such as tetrafluoroborate, tetraphenylborate or the like), a phosphate ion (such as hexafluorophosphate or the like), and an acetate ion (such as acetate, trifluoroacetate, picolinate or the like), among which a sulfonate ion, a perchlorate ion, a borate ion or a phosphate ion is preferable, and a borate ion or a phosphate ion is more preferable.

n represents a number of 0 or larger, determined in such a manner that the compound represented by the formula (I-A) becomes a neutral molecule, and n=0 in the case where a central complex portion is neutral or the central complex portion is a cation and forms an intramolecular salt with a substituent and/or a linking group.

Now the compound represented by the formula (II) will be explained in detail.

The metal represented by $M^2$ is not particularly restricted, but is preferably from 0-valent to tetravalent, more preferably from univalent to trivalent. Specific examples of the metal represented by $M^2$ include Li, Be, Mg, Ba, Al, Ca, Fe, Co, Ni, Cu, Zn, Ga, Ru, Rh, Pd, Ag, W, Re, Os, Ir, Pt, Au, Eu, Tb and Yb. In the case that the compound represented by the formula (II) is used as a hole transporting material (a hole injection material, a hole transport material, an electron blocking material, a host material of the light emission layer or the like), the metal is preferably Cu, Ru, Rh, Pd, Ir or Pt, more preferably Cu or Pt and particularly preferably Pt. In the case that the compound represented by the formula (II) is used as an electron transporting material (an electron injection material, an electron transport material, a hole blocking material, a host material of the light emission layer or the like), the metal is preferably Be, Mg, Al, Zn, Ga, Ru, Rh, Pd or Pt, more preferably Zn or Pt, and particularly preferably Pt. Also in the case that the compound represented by the formula (II) is used as a light emitting material, the metal is preferably Cu, Ru, Rh, Pd, Re, Ir or Pt, more preferably Ru, Rh, Pd, Re or Pt and particularly preferably Pt.

Atomic groups represented by $L^{21}$, $L^{22}$, $L^{23}$ and $L^{24}$ and coordinated to $M^2$ have respectively same meanings as $L^{11}$ to $L^{14}$ in the formula (I).

Preferable examples of $L^{21}$, $L^{22}$ and $L^{23}$ are same as the preferable atomic groups cited for $L^{11}$ to $L^{14}$ in the formula (I).

The atomic group represented by $L^{24}$ and coordinated to $M^2$ is preferably an atomic group coordinated by a carbon atom, an atomic group coordinated by a nitrogen atom, an atomic group coordinated by an oxygen atom, an atomic group coordinated by a sulfur atom, or an atomic group coordinated by a phosphorus atom, more preferably an atomic group coordinated by a carbon atom, an atomic group coordinated by a nitrogen atom, an atomic group coordinated by an oxygen atom, or an atomic group coordinated by a sulfur atom, further preferably an aryl group coordinated by a carbon atom, a heteroaryl group coordinated by a carbon atom, a heteroaryl group coordinated by a nitrogen atom, a carboxyl group coordinated by an oxygen atom, an aryloxy group coordinated by an oxygen atom, a heteroaryloxy group coordinated by an oxygen atom, a silyloxy group coordinated by an oxygen atom, an arylthio group coordinated by a sulfur atom, or a heteroarylthio group coordinated by a sulfur atom, and particularly preferably an aryloxy group coordinated by an oxygen atom, or a heteroaryloxy group coordinated by an oxygen atom.

$Y^{21}$ and $Y^{22}$ respectively have same meanings as $Y^{11}$ and $Y^{12}$ in the formula (I), and have similar preferable ranges.

Each of an $M^2$-$L^{21}$ bond, an $M^2$-$L^{22}$ bond, an $M^2$-$L^{23}$ bond, and an $M^2$-$L^{24}$ bond may be a covalent bond, a coordination bond or an ionic bond.

Among the compounds represented by the formula (II), preferable ones are those represented by a following formula (II-A).

The substituents represented by $R^{b1}$, $R^{b2}$, $R^{b3}$ and $R^{b4}$ have same meanings as $R^{a1}$ and $R^{a2}$ in the formula (I-A), and have similar preferable ranges.

$m^{b1}$, $m^{b2}$, $m^{b3}$ and $m^{b4}$ each independently are preferably from 0 to 2, more preferably 0 or 1 and further preferably 0. In the case that $m^{b1}$, $m^{b2}$, $m^{b3}$ or $m^{b4}$ is 2 or 3, plural $R^{b1}$s, $R^{b2}$s, $R^{b3}$s and $R^{b4}$s may be the same or different each other.

Now the compound represented by the formula (III) will be explained in detail.

The metal represented by $M^3$ is not particularly restricted, but is preferably from 0-valent to tetravalent, more preferably from univalent to trivalent. Specific examples of the metal represented by $M^3$ include Li, Be, Mg, Ba, Al, Ca, Fe, Co, Ni, Cu, Zn, Ga, Ru, Rh, Pd, Ag, W, Re, Os, Ir, Pt, Au, Eu, Tb and Yb. In the case that the compound represented by the formula (III) is used as a hole transporting material (a hole injection material, a hole transport material, an electron blocking material, a host material of the light emission layer or the like), the metal is preferably Cu, Ru, Rh, Pd, Ir or Pt, more preferably Cu or Ir and particularly preferably Ir. In the case that the compound represented by the formula (III) is used as an electron transporting material (an electron injection material, an electron transport material, a hole blocking material, a host material of the light emission layer or the like), the metal is preferably Be, Mg, Al, Zn, Ga, Ru, Rh, Pd or Pt, more preferably Al, Ga or Pt and particularly preferably Pt. Also in the case that the compound represented by the formula (III) is used as a light emitting material, the metal is preferably Cu, Formula (II-A)

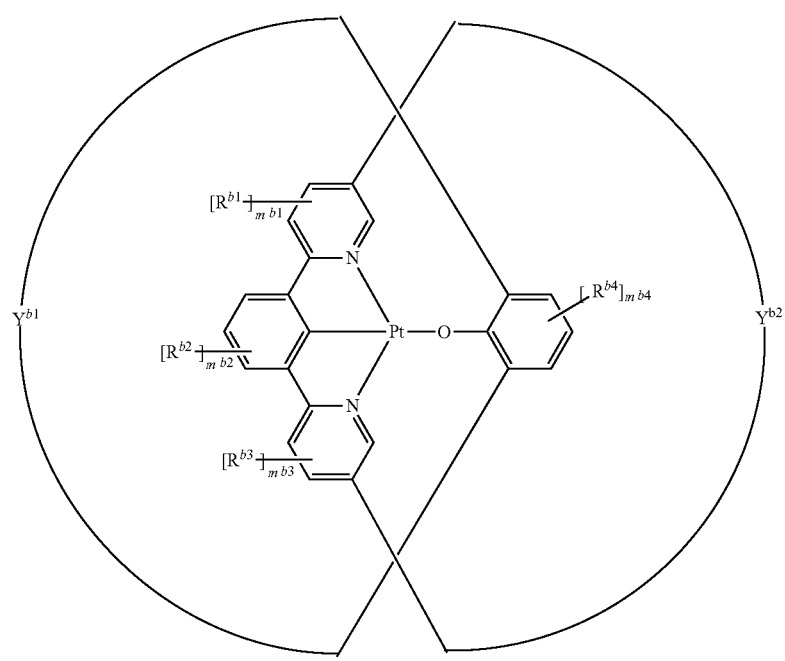

In the formula (II-A), $Y^{b1}$ and $Y^{b2}$ each represent a linking group; $R^{b1}$, $R^{b2}$, $R^{b3}$ and $R^{b4}$ each represent a substituent; $m^{b1}$, $m^{b2}$, $m^{b3}$ and $m^{b4}$ each represent an integer from 0 to 3.

The linking groups represented by $Y^{b1}$ and $Y^{b2}$ have same meanings as $Y^{11}$ and $Y^{12}$ in the formula (I), and have similar preferable ranges.

Ru, Rh, Pd, Re, Ir or Pt, more preferably Ru, Rh, Pd, Re, Ir or Pt, further preferably Re, Ir or Pt and particularly preferably Ir.

Among the compounds represented by the formula (III), preferable ones are those represented by a following formula (III-A).

Formula (III-A)

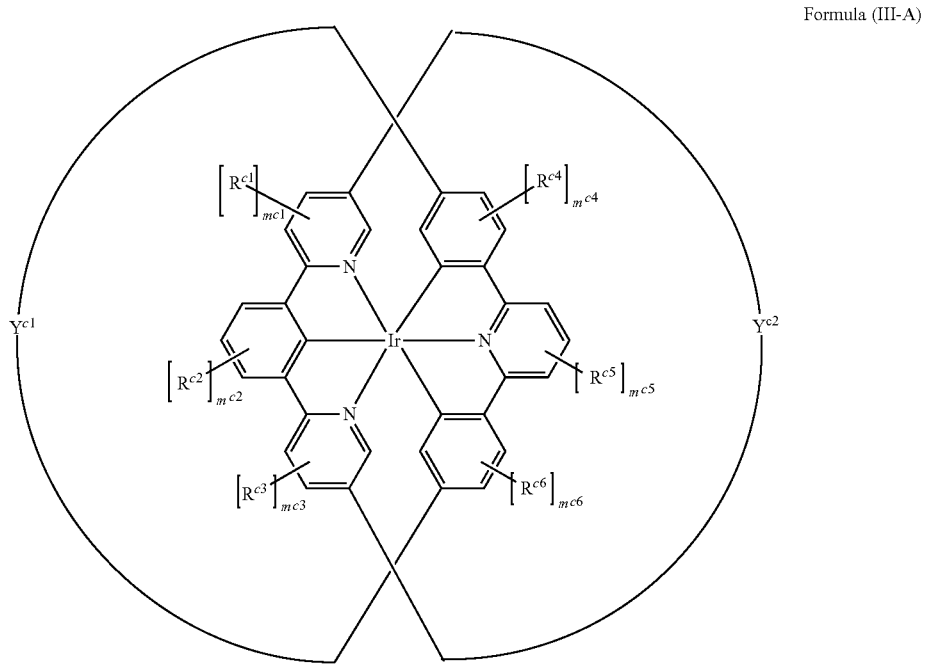

In the formula (III-A), $Y^{c1}$ and $Y^{c2}$ each represent a linking group; $R^{c1}$, $R^{c2}$, $R^{c3}$, $R^{c4}$, $R^{c5}$ and $R^{b6}$ each represent a substituent; $m^{c1}$, $m^{c2}$, $m^{c3}$, $m^{c4}$, $m^{c5}$ and $m^{c6}$ each represent an integer from 0 to 3.

The linking groups represented by $Y^{c1}$ and $Y^{c2}$ have same meanings as $Y^{11}$ and $Y^{12}$ in the formula (I), and have similar preferable ranges.

The substituents represented by $R^{c1}$, $R^{c2}$, $R^{c3}$, $R^{c4}$, $R^{c5}$ and $R^{b6}$ have same meanings as $R^{a1}$ and $R^{a2}$ in the formula (I-A), and have similar preferable ranges.

$m^{c1}$, $m^{c2}$, $m^{c3}$, $m^{c4}$, $m^{c5}$ and $m^{c6}$ each independently are preferably from 0 to 2, more preferably 0 or 1 and further preferably 0. In the case that $m^{c1}$, $m^{c2}$, $m^{c3}$, $m^{c4}$, $m^{c5}$ or $m^{c6}$ is 2 or 3, plural $R^{c1}$s, $R^{c2}$s, $R^{c3}$s, $R^{c4}$s, $R^{c5}$s or $R^{b6}$s may be the same or different each other.

In the following, specific examples of the interlocked compound to be employed in the present invention will be shown, but the invention is not limited to such examples.

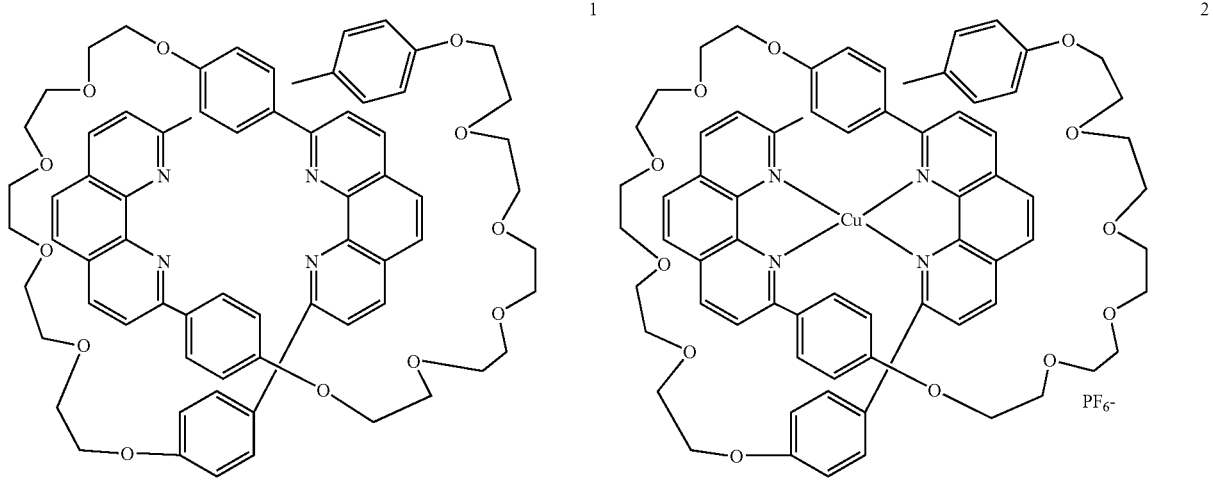

-continued
3
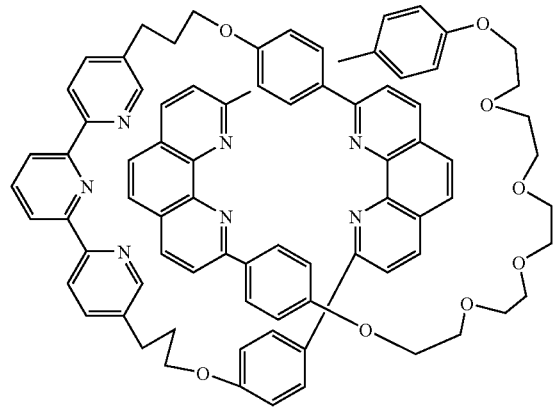
4
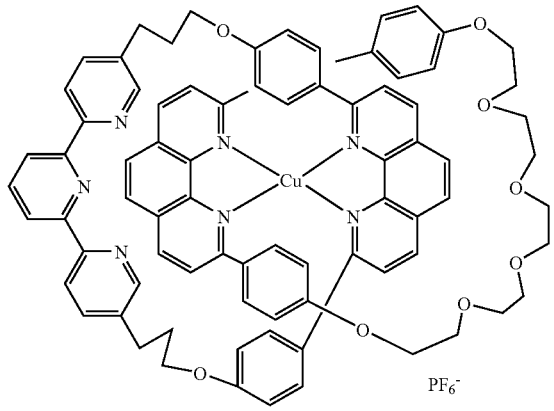
PF$_6^-$
5
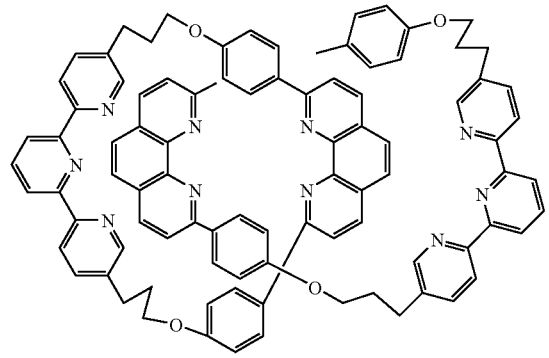
6
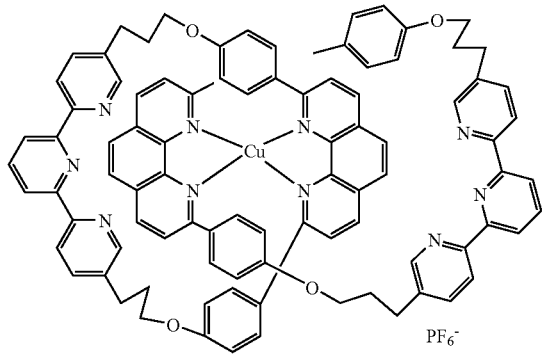
PF$_6^-$
7
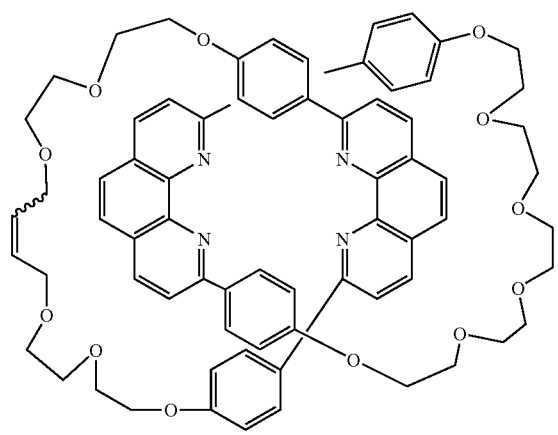
cis/trans mixture
8
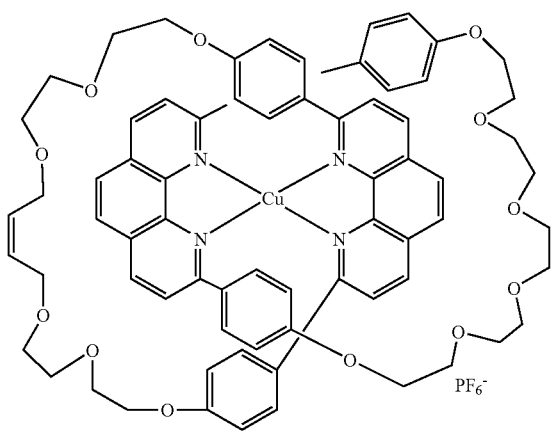
PF$_6^-$
cis/trans mixture -continued
9
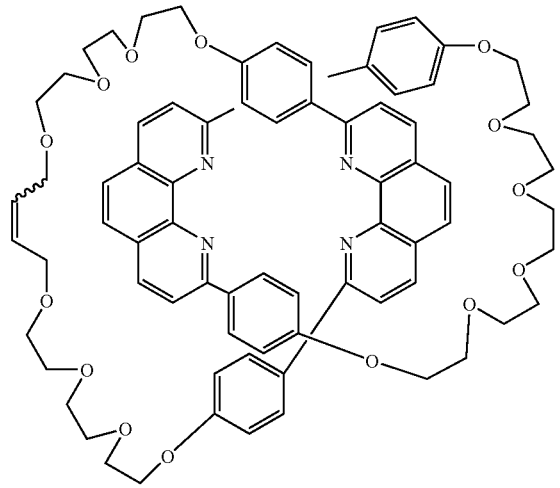
cis/trans mixture
10
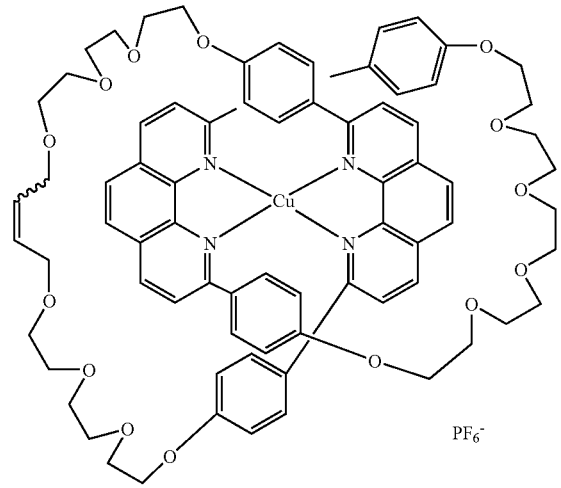
PF6-
cis/trans mixture
11
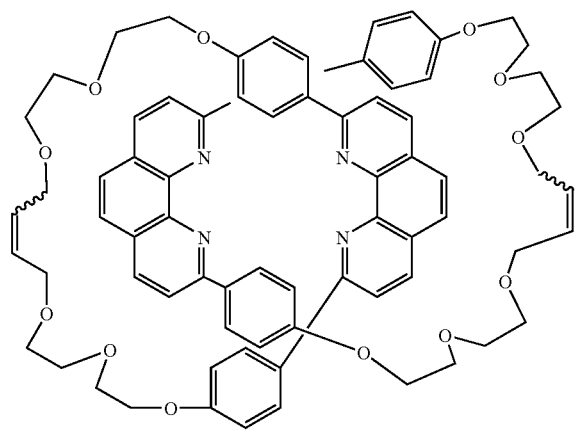
cis/trans mixture
12
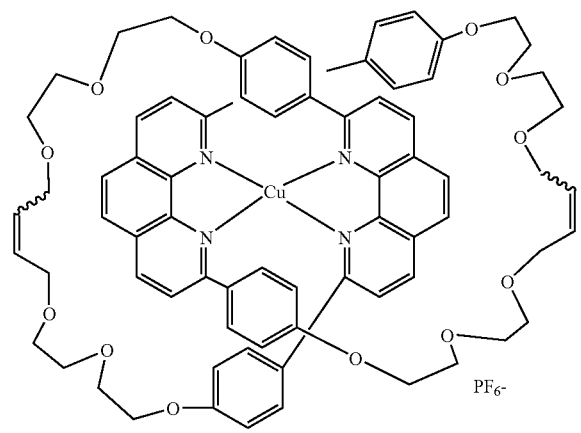
PF6-
cis/trans mixture
13
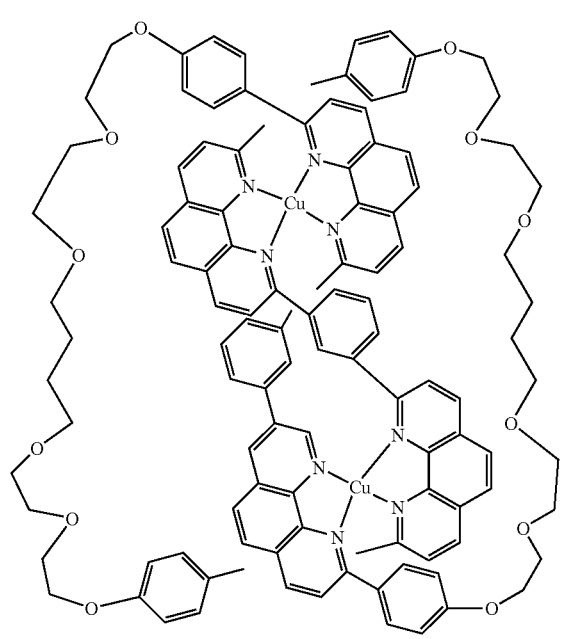
2BF4-
14
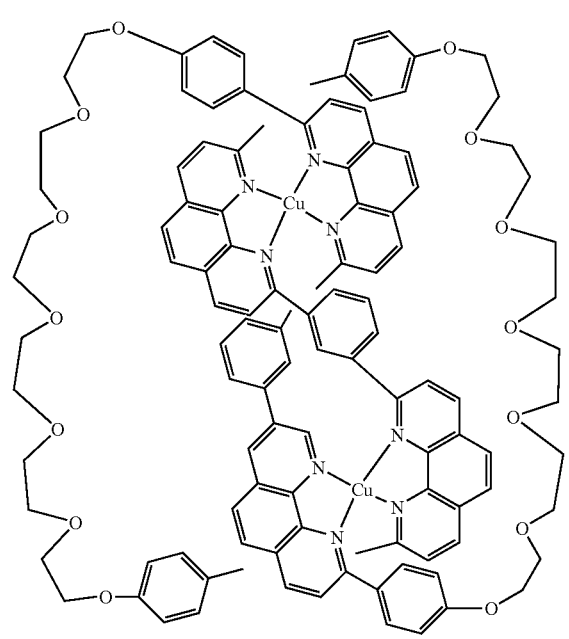
2BF4-

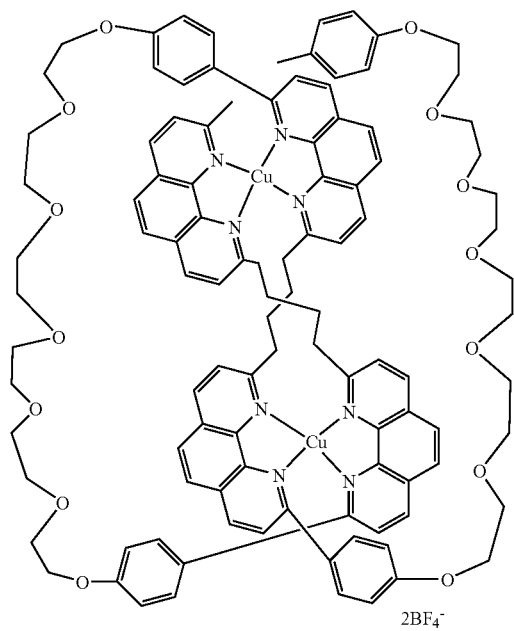
15
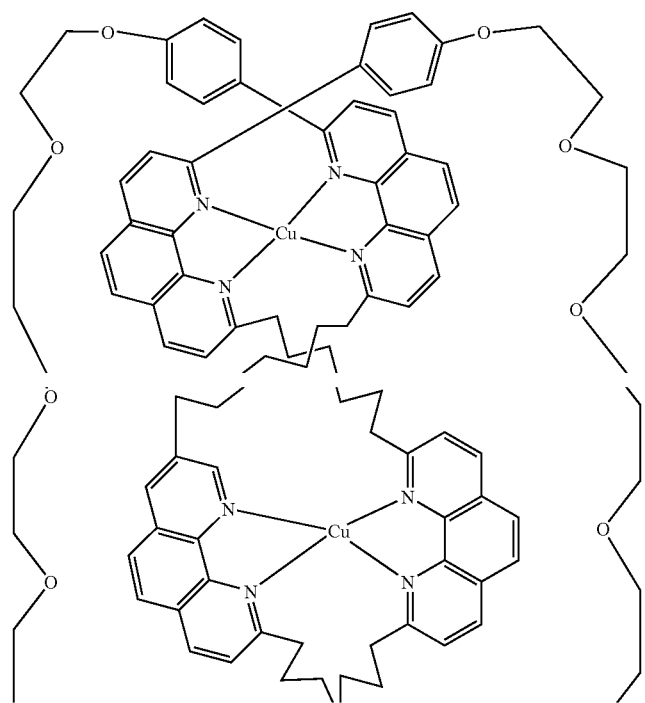
16

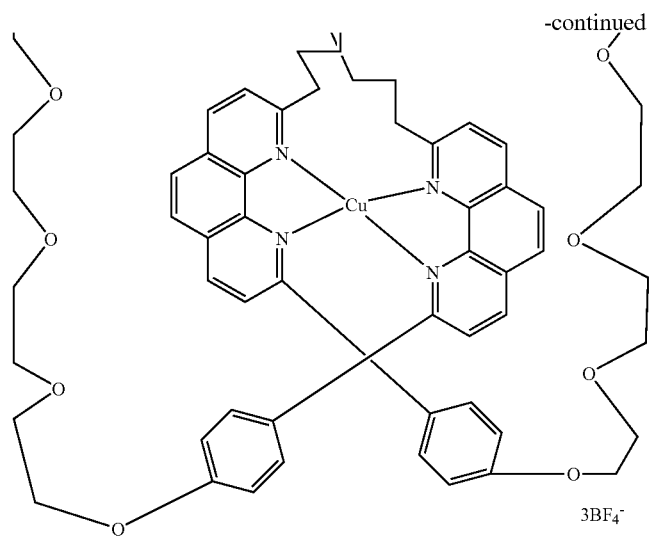
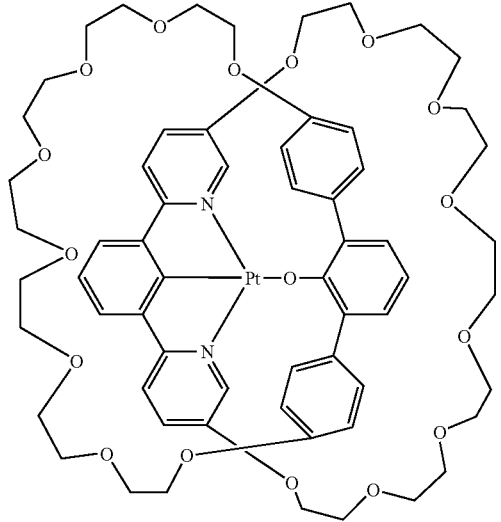
17
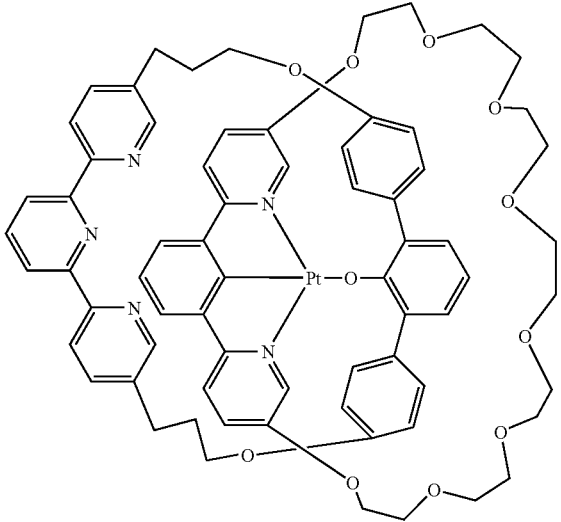
18
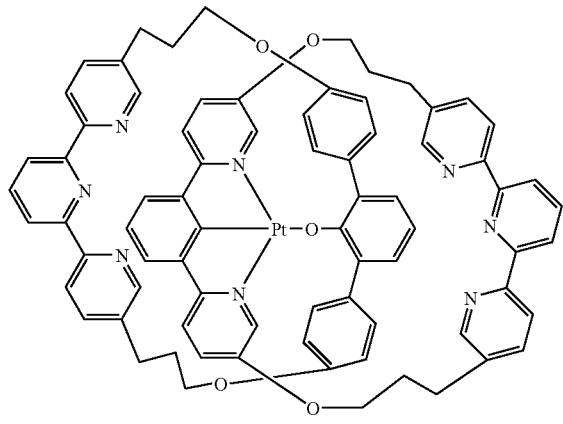
19
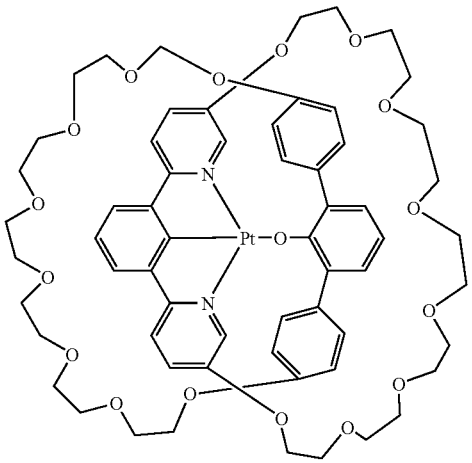
20

-continued
21
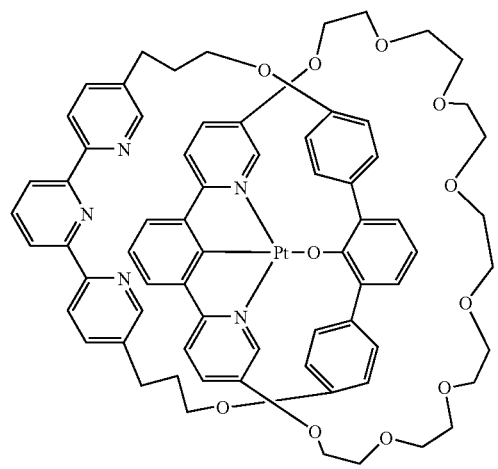
22
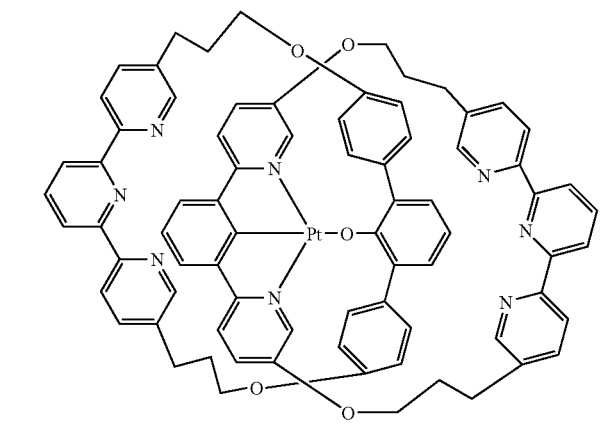
23
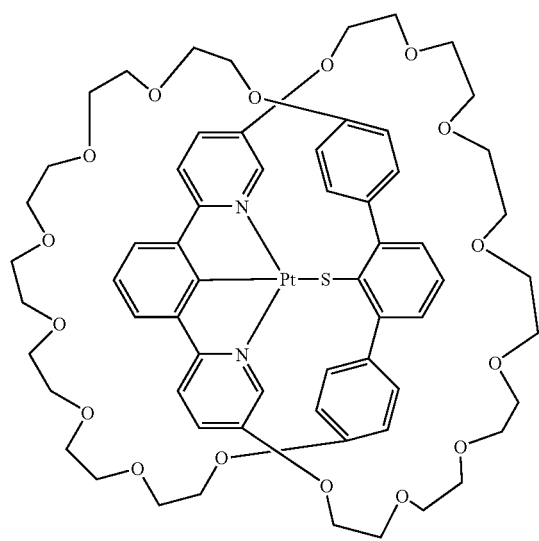
24
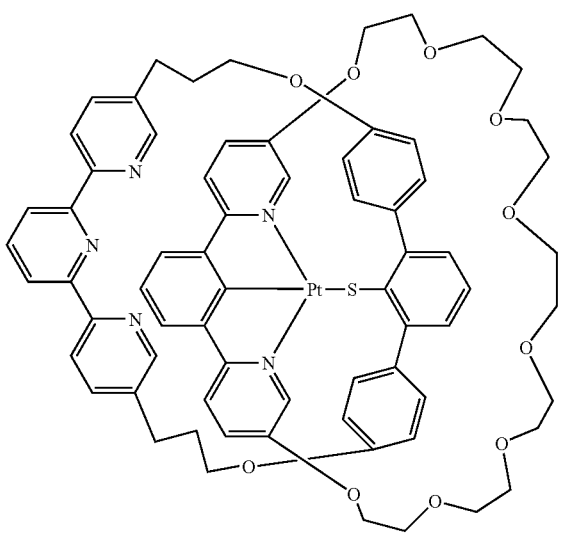
25
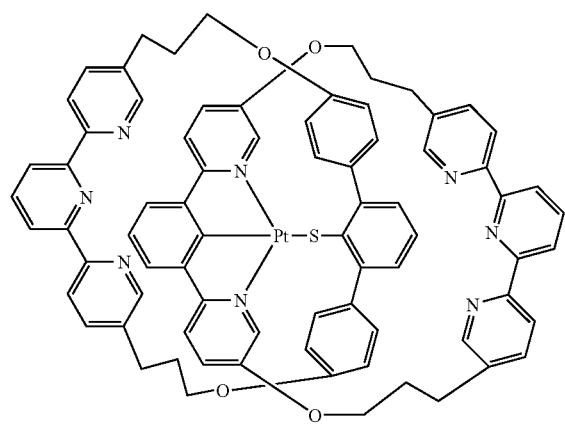
26
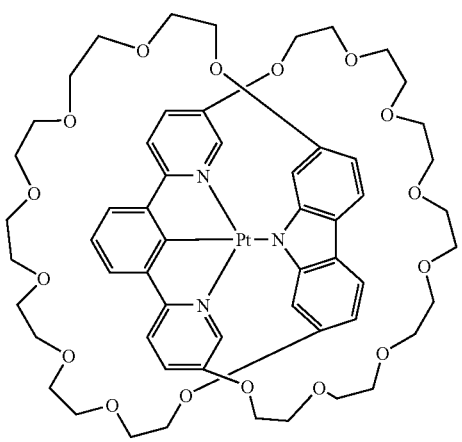

27
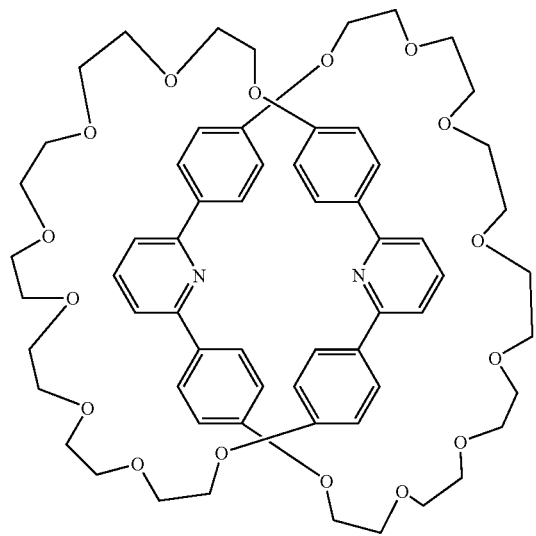
28
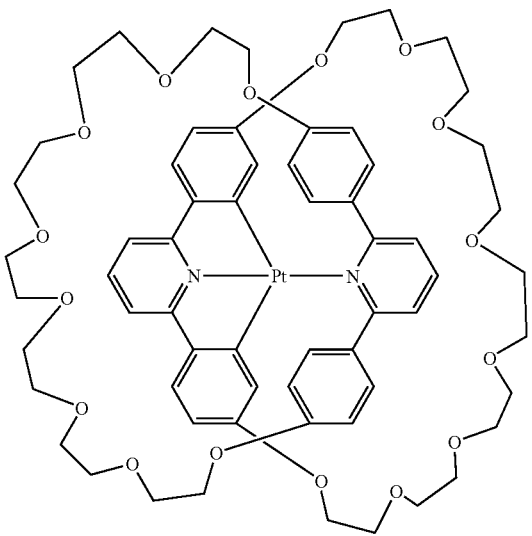
29
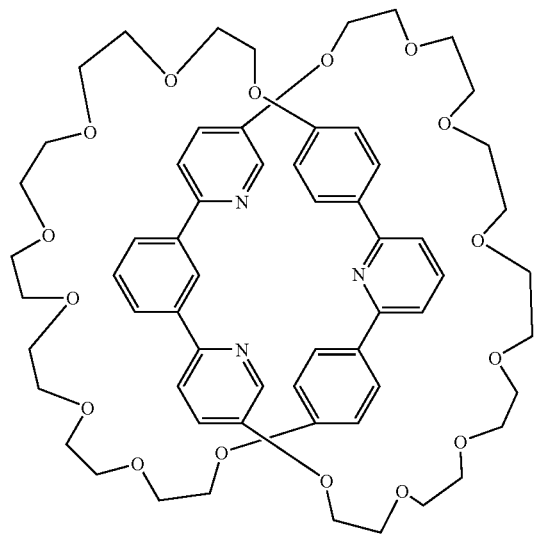
30
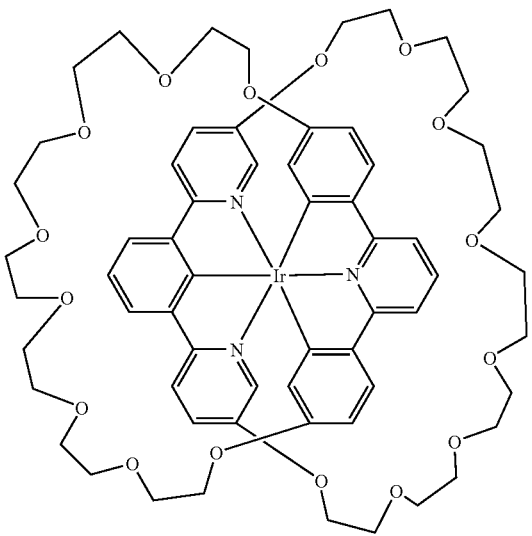
31
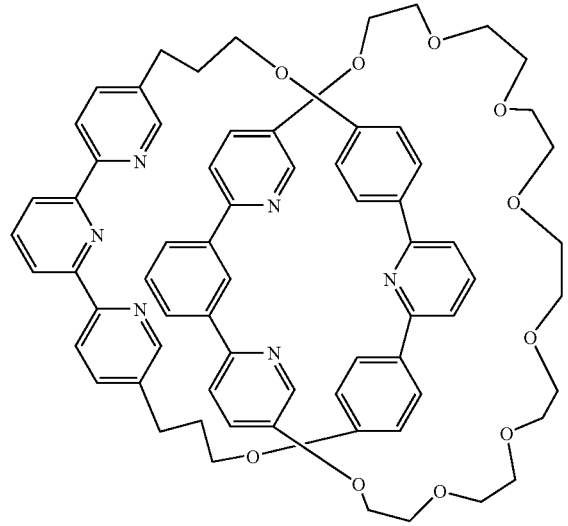
32
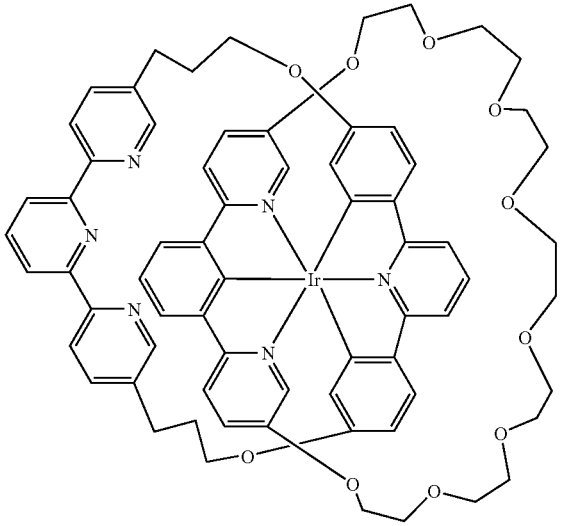

-continued
33
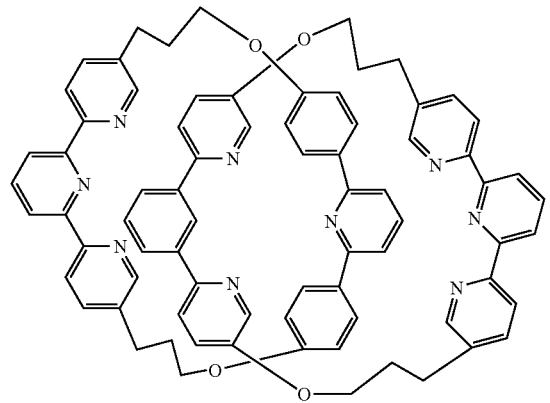
34
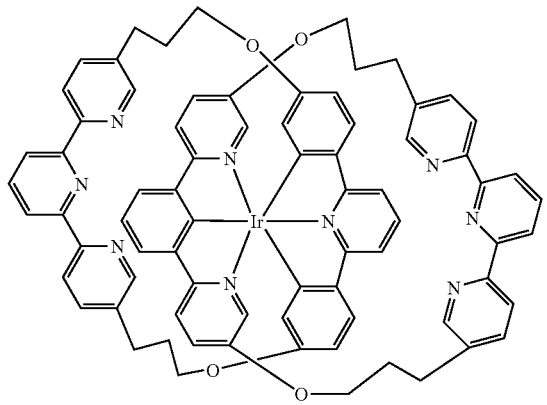
35
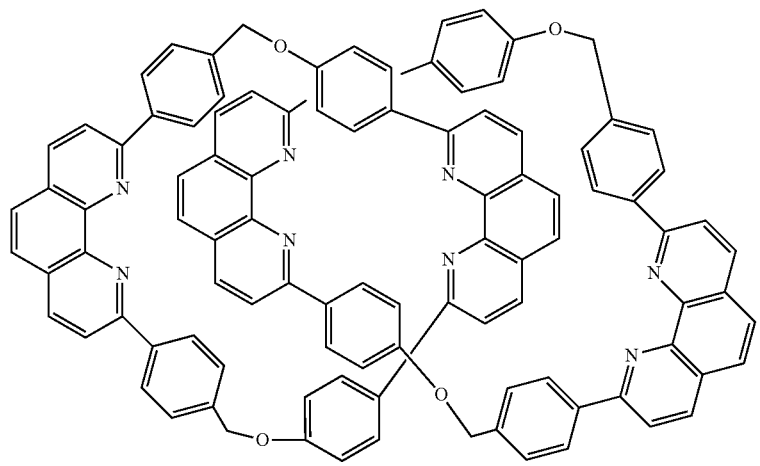
36
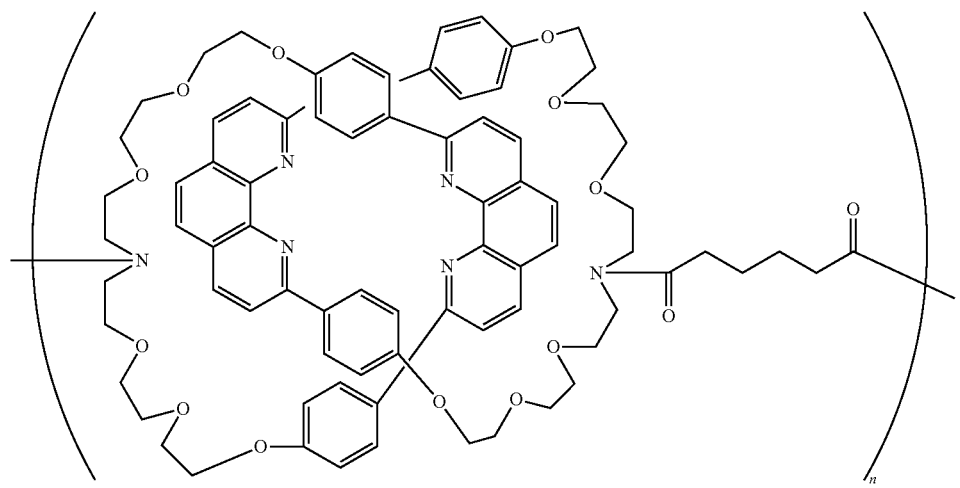

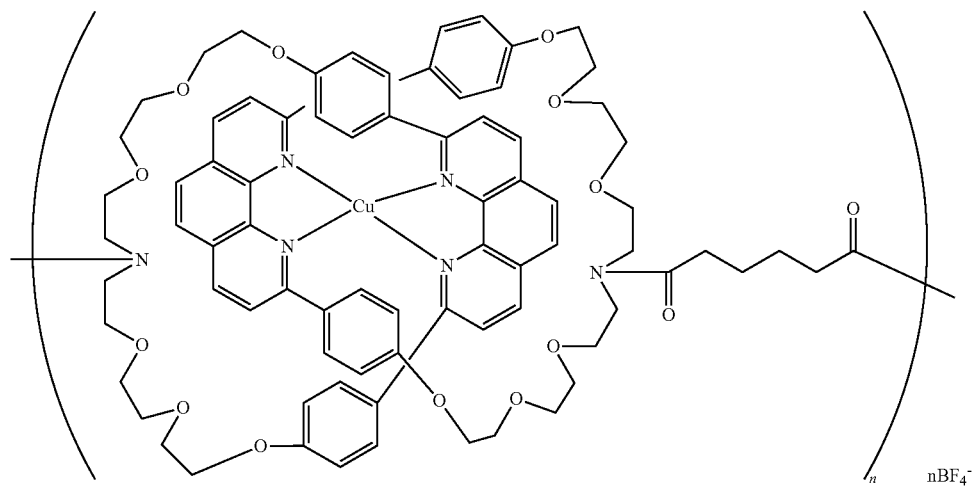
37
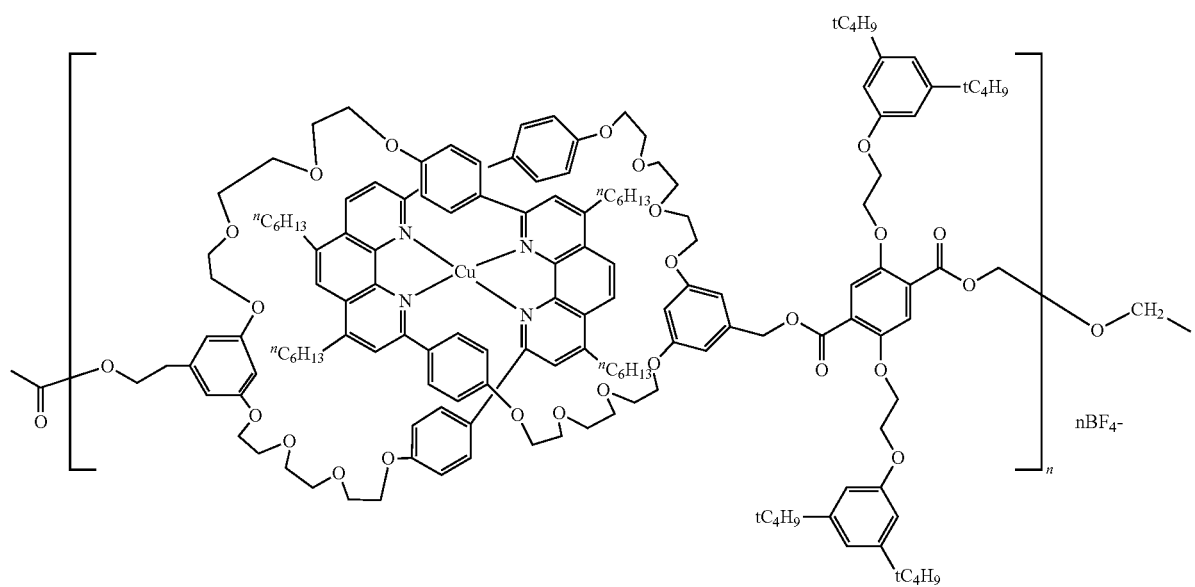
38
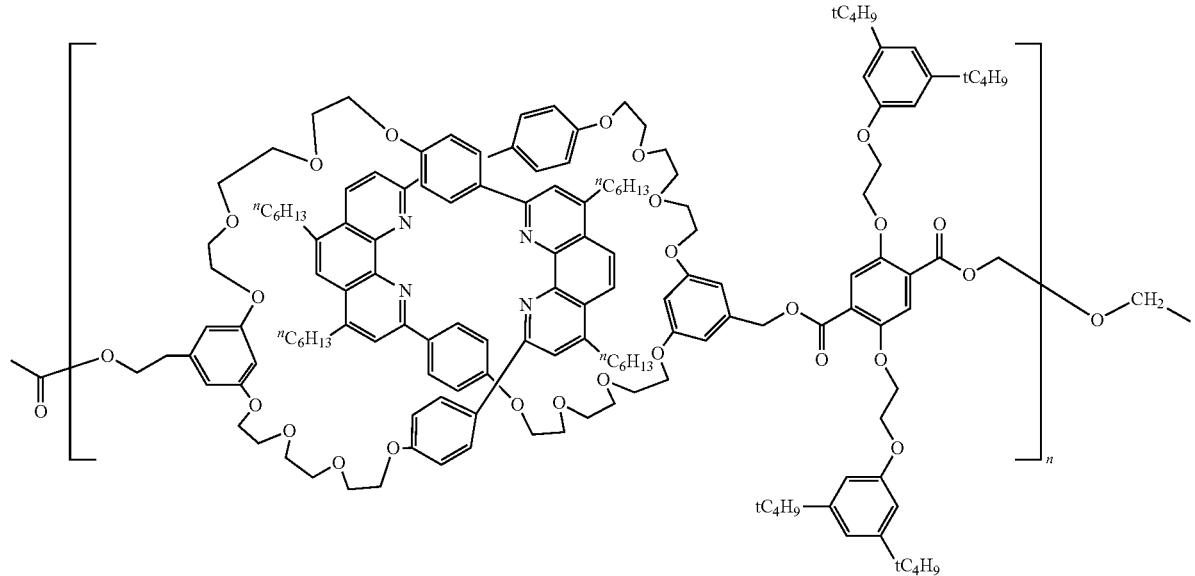
39

<Synthesizing Method for Interlocked Compound>

Representative examples of the synthesizing method for the interlocked compound include a template method (mold method) and a self assembling method. The template method is based on attracting plural linear molecules each other, or a cyclic molecule and a linear molecule, by means of an interaction such as a coordination bonding, a doner-acceptor interaction or a hydrogen bonding, and cyclizing the linear molecule, thereby constructing an interlocked skeleton. The self assembling method is based on designing a skeleton in which an interlocked structure becomes thermodynamically stable, and causing a reversible bond formation thereby forming an interlocked compound as a result of a thermodynamic equilibrium.

The interlocked compound to be employed in the present invention may be synthesized according to the processes described for example, in Angew. Chem. Int. Ed. Engl. vol. 28, page 189 (1989); Angew. Chem. Int. Ed. Engl. vol. 32, page 1434 (1993); J. Am. Chem. Soc. vol. 116, page 375 (1994); J. Am. Chem. Soc., Chem. Commun., 2231 (1994); Angew. Chem. Int. Ed. Engl. vol. 36, page 1308 (1997); J. Am. Chem. Soc., Chem. Commun., 2053 (1997); and references cited therein.

<Application>

In the present invention, the interlocked compound may be employed as a hole injection layer, a hole transport layer, a light emission layer, an electron transport layer, an electron injection layer, an electron blocking layer, a hole blocking layer or the like. The preferable layer for use is variable depending on the design of the interlocked compound, but an interlocked compound of metal complex is preferably employed in a hole injection layer, a light emission layer, an electron transport layer, or an electron injection layer, and more preferably in a hole injection layer or a light emission layer.

<Method of Usage>

In the invention, the layer containing the interlocked compound is not particularly restricted in a forming method, and may be formed by a resistance-heated evaporation process, an electron beam process, a sputtering process, a molecular orienting process, a wet coating process (such as spray coating, dip coating, impregnation coating, roll coating, gravure coating, reverse coating, roll brush coating, air-knife coating, curtain coating, spin coating, flow coating, bar coating, microgravure coating, air-doctor coating, blade coating, squeeze coating, transfer roll coating, kiss coating, cast coating, extrusion coating, wired bar coating, screen coating or the like), an ink jet process, a printing process, a transfer process or the like. As the interlocked compound to be employed in the invention may be dissolved at a high concentration in a solvent, the wet coating process may be utilized advantageously.

In case of preparation by the coating process, the concentration of the interlocked compound is not particularly restricted, but is preferably from 0.0001 to 90 mass %, more preferably from 0.001 to 70 mass %, further preferably from 0.01 to 50 mass %, and particularly preferably from 0.1 to 30 mass %.

In case of the coating process, a solvent to be employed is not particularly restricted, and preferable examples thereof include an aromatic hydrocarbon solvent (such as benzene, toluene, ethylbenzene, xylene, chlorobenzene or the like), a halogenated hydrocarbon solvent (such as dichloroethane, chloroform or the like), an ether solvent (such as tetrahydrofuran, dioxane or the like), an amide solvent (such as dimethylformamide, dimethylacetamide or the like), an ester solvent (such as ethyl acetate or the like), an alcohol solvent (such as methanol or the like), a ketone solvent (such as acetone, methyl ethyl ketone, cyclohexanone or the like), a sulfoxide solvent (such as dimethylsulfoxide or the like), and a nitrile solvent (such as acetonitrile or the like) and the like. These solvents may be employed singly or in a mixture of two or more kinds.

Examples of the method of coating include a process of dissolving or dispersing the interlocked compound in a solvent and coating such solution or dispersion (the aforementioned examples of the wet coating process being applicable), an ink jet process and a printing process. In case of the coating process, the interlocked compound is dissolved or dispersed in a solvent together with a resin component. The coating liquid may be prepared by dissolving or dispersing the interlocked compound together with the resin component. For such resin component, there can be used, for example, polyvinyl chloride, polycarbonate, polystyrene, polymethyl methacrylate, polybutyl methacrylate, polyester, polysulfone, polyphenylene oxide, polybutadiene, poly(N-vinylcarbazole), a hydrocarbon resin, a ketone resin, a phenoxy resin, polyamide, ethylcellulose, polyvinyl acetate, an ABS resin, polyurethane, a melamine resin, an unsaturated polyester resin, an alkyd resin, an epoxy resin, a silicone resin or the like.

<Film Thickness>

In case of utilizing the interlocked compound in a hole injection layer, the film thickness thereof is not particularly restricted but is preferably from 1 nm to 2 µm, more preferably from 5 nm to 500 nm, and particularly preferably from 10 nm to 500 nm. A film thickness less than 1 nm results in disadvantages of a short circuiting or an unevenness in luminance by irregularities on the electrodes, and a film thickness exceeding 2 µm leads to a disadvantage of an increase in drive voltage.

In case of utilizing the interlocked compound in a hole transport layer, the film thickness thereof is not particularly restricted but is preferably from 1 nm to 500 nm, more preferably from 3 nm to 300 nm, and particularly preferably from 5 nm to 100 nm.

A film thickness less than 1 nm results in disadvantages of a short circuiting or an unevenness in luminance for example by irregularities on the electrodes, and a film thickness exceeding 500 nm leads to a disadvantage of an increase in drive voltage.

In case of utilizing the interlocked compound in a light emission layer, the film thickness thereof is not particularly restricted but is preferably from 5 nm to 1 µm, more preferably from 10 nm to 100 nm, and particularly preferably from 20 nm to 80 nm.

In case of utilizing the interlocked compound in an electron transport layer, the film thickness thereof is not particularly restricted but is preferably from 1 nm to 1 µm, more preferably from 3 nm to 100 nm, and particularly preferably from 5 nm to 60 nm.

In case of utilizing the interlocked compound in an electron injection layer, the film thickness thereof is not particularly restricted but is preferably from 1 nm to 1 µm, more preferably from 3 nm to 100 nm, and particularly preferably from 5 nm to 60 nm.

The film thicknesses mentioned above are preferable in satisfying drive voltage, light emission efficiency and durability at the same.

2. Elements for Constituting Organic Electroluminescence Device

In the following, elements for constituting an organic electroluminescence device of the present invention will be described in detail.

(Substrate)

According to the present invention, a substrate may be applied. The substrate to be applied is preferably one which does not scatter or attenuate light emitted from the organic compound layer. Specific examples of materials for the substrate include zirconia-stabilized yttrium (YSZ); inorganic materials such as glass; polyesters such as polyethylene terephthalate, polybutylene phthalate, and polyethylene naphthalate; and organic materials such as polystyrene, polycarbonate, polyethersulfon, polyarylate, polyimide, polycycloolefin, norbornene resin, poly(chlorotrifluoroethylene), and the like.

For instance, when glass is used as the substrate, non-alkali glass is preferably used with respect to the quality of material in order to decrease ions eluted from the glass. In the case of employing soda-lime glass, it is preferred to use glass on which a barrier coat such as silica has been applied. In the case of employing an organic material, it is preferred to use a material excellent in heat resistance, dimension stability, solvent resistance, electrical insulation, and workability.

There is no particular limitation as to the shape, the structure, the size or the like of the substrate, but it may be suitably selected according to the application, purposes and the like of the luminescent device. In general, a plate-like substrate is preferred as the shape of the substrate. A structure of the substrate may be a monolayer structure or a laminated structure. Furthermore, the substrate may be formed from a single member or two or more members.

Although the substrate may be in a transparent and colorless, or a transparent and colored condition, it is preferred that the substrate is transparent and colorless from the viewpoint that the substrate does not scatter or attenuate light emitted from the organic light-emitting layer.

A moisture permeation preventive layer (gas barrier layer) may be provided on the front surface or the back surface of the substrate.

For a material of the moisture permeation preventive layer (gas barrier layer), inorganic substances such as silicon nitride and silicon oxide may be preferably applied. The moisture permeation preventive layer (gas barrier layer) may be formed in accordance with, for example, a high-frequency sputtering method or the like.

In the case of applying a thermoplastic substrate, a hard-coat layer or an under-coat layer may be further provided as needed.

(Anode)

The anode may generally be any material as long as it has a function as an electrode for supplying positive holes to the organic compound layer, and there is no particular limitation as to the shape, the structure, the size or the like. However, it may be suitably selected from among well-known electrode materials according to the application and purpose of luminescent device. As mentioned above, the anode is usually provided as a transparent anode.

Materials for the anode may preferably include, for example, metals, alloys, metal oxides, electroconductive compounds, and mixtures thereof, and those having a work function of 4.0 eV or more are preferred. Specific examples of the anode materials include electroconductive metal oxides such as tin oxides doped with antimony, fluorine or the like (ATO and FTO), tin oxide, zinc oxide, indium oxide, indium tin oxide (ITO), and indium zinc oxide (IZO); metals such as gold, silver, chromium, and nickel; mixtures or laminates of these metals and the electroconductive metal oxides; inorganic electroconductive materials such as copper iodide and copper sulfide; organic electroconductive materials such as polyaniline, polythiophene, and polypyrrole; and laminates of these inorganic or organic electron-conductive materials with ITO. Among these, the electroconductive metal oxides are preferred, and particularly, ITO is preferable in view of productivity, high electroconductivity, transparency and the like.

The anode may be formed on the substrate in accordance with a method which is appropriately selected from among wet methods such as printing methods, coating methods and the like; physical methods such as vacuum deposition methods, sputtering methods, ion plating methods and the like; and chemical methods such as CVD and plasma CVD methods and the like, in consideration of the suitability to a material constituting the anode. For instance, when ITO is selected as a material for the anode, the anode may be formed in accordance with a DC or high-frequency sputtering method, a vacuum deposition method, an ion plating method or the like.

In the organic electroluminescence device of the present invention, a position at which the anode is to be formed is not particularly limited, but it may be suitably selected according to the application and purpose of the luminescent device. The anode may be formed on either the whole surface or a part of the surface on either side of the substrate.

For patterning to form the anode, a chemical etching method such as photolithography, a physical etching method such as etching by laser, a method of vacuum deposition or sputtering through superposing masks, or a lift-off method or a printing method may be applied.

A thickness of the anode may be suitably selected according to the material constituting the anode and is therefore not definitely decided, but it is usually in the range of around 10 nm to 50 µm, and preferably 50 nm to 20 µm.

A value of resistance of the anode is preferably $10^3 \Omega/\square$ or less, and $10^2 \Omega/\square$ or less is more preferable. In the case where the anode is transparent, it may be either transparent and colorless, or transparent and colored. For extracting luminescence from the transparent anode side, it is preferred that a light transmittance of the anode is 60% or higher, and more preferably 70% or higher.

Concerning transparent anodes, there is a detailed description in "TOUMEI DENNKYOKU-MAKU NO SHINTENKAI (Novel Developments in Transparent Electrode Films)" edited by Yutaka Sawada, published by C.M.C. in 1999, the contents of which are incorporated by reference herein. In the case where a plastic substrate having a low heat resistance is applied, it is preferred that ITO or IZO is used to obtain a transparent anode prepared by forming the film at a low temperature of 150° C. or lower.

(Cathode)

The cathode may generally be any material as long as it has a function as an electrode for injecting electrons to the organic compound layer, and there is no particular limitation as to the shape, the structure, the size or the like. However it may be suitably selected from among well-known electrode materials according to the application and purpose of the luminescent device.

Materials constituting the cathode may include, for example, metals, alloys, metal oxides, electroconductive compounds, and mixtures thereof, and materials having a work function of 4.5 eV or less are preferred. Specific examples thereof include alkali metals (e.g., Li, Na, K, Cs or the like), alkaline earth metals (e.g., Mg, Ca or the like), gold, silver, lead, aluminum, sodium-potassium alloys, lithium-aluminum alloys, magnesium-silver alloys, rare earth metals such as indium, and ytterbium, and the like. They may be used alone, but it is preferred that two or more of them are used in combination from the viewpoint of satisfying both stability and electron injectability.

Among these, as the materials for constituting the cathode, alkaline metals or alkaline earth metals are preferred in view of electron injectability, and materials containing aluminum as a major component are preferred in view of excellent preservation stability.

The term "material containing aluminum as a major component" refers to a material constituted by aluminum alone; alloys comprising aluminum and 0.01% by mass to 10% by mass of an alkaline metal or an alkaline earth metal; or the mixtures thereof (e.g., lithium-aluminum alloys, magnesium-aluminum alloys and the like).

Regarding materials for the cathode, they are described in detail in JP-A Nos. 2-15595 and 5-121172, of which are incorporated by reference herein.

A method for forming the cathode is not particularly limited, but it may be formed in accordance with a well-known method.

For instance, the cathode may be formed in accordance with a method which is appropriately selected from among wet methods such as printing methods, coating methods and the like; physical methods such as vacuum deposition methods, sputtering methods, ion plating methods and the like; and chemical methods such as CVD and plasma CVD methods and the like, in consideration of the suitability to a material constituting the cathode. For example, when a metal (or metals) is (are) selected as a material (or materials) for the cathode, one or two or more of them may be applied at the same time or sequentially in accordance with a sputtering method or the like.

For patterning to form the cathode, a chemical etching method such as photolithography, a physical etching method such as etching by laser, a method of vacuum deposition or sputtering through superposing masks, or a lift-off method or a printing method may be applied.

In the present invention, a position at which the cathode is to be formed is not particularly limited, and it may be formed on either the whole or a part of the organic compound layer.

Furthermore, a dielectric material layer made of fluorides, oxides or the like of an alkaline metal or an alkaline earth metal may be inserted in between the cathode and the organic compound layer with a thickness of 0.1 nm to 5 nm. The dielectric layer may be considered to be a kind of electron injection layer. The dielectric material layer may be formed in accordance with, for example, a vacuum deposition method, a sputtering method, an ion-plating method or the like.

A thickness of the cathode may be suitably selected according to materials for constituting the cathode and is therefore not definitely decided, but it is usually in the range of around 10 nm to 5 µm, and preferably 50 nm to 1 µm.

Moreover, the cathode may be transparent or opaque. The transparent cathode may be formed by preparing a material for the cathode with a small thickness of 1 nm to 10 nm, and further laminating a transparent electroconductive material such as ITO or IZO thereon.

(Organic Compound Layer)

An organic compound layer according to the present invention will be described.

The organic electroluminescence device of the present invention has at least one organic compound layer including a light-emitting layer. Examples of the organic compound layers other than the light-emitting layer include, as mentioned above, respective layers of a positive hole-injection layer, a positive hole-transport layer, a positive hole transporting intermediate layer, a light-emitting layer, an electron transporting intermediate layer, an electron-transport layer, an electron injection layer and the like.

—Formation of Organic Compound Layer—

In the organic electroluminescence device of the present invention, the respective layers constituting the organic compound layers can be suitably formed in accordance with any of a dry film-forming method such as a vapor deposition method, or a sputtering method; a transfer method; a printing method; a coating method; an ink-jet printing method; or a spray method.

—Light-Emitting Layer—

The light-emitting layer is a layer having a function for receiving positive holes from the anode, the positive hole-injection layer, the positive hole-transport layer or the positive hole transporting buffer layer, and receiving electrons from the cathode, the electron injection layer, the electron-transport layer, or the electron transporting buffer layer, and for providing a field for recombination of the positive holes with the electrons to emit a light.

The light emission layer in the invention may be formed solely of a light emitting material, or may be constructed as a mixed layer of a host material and a light emitting material. The light emitting material may be a fluorescence emitting material or a phosphorescence emitting material, and a dopant may be used in one kind or in two or more kinds. The host material is preferably a charge transporting material. The host material may be used in single or in a combination of two or more, for example a combination including a mixture of an electron transporting host material and a hole transporting host material. Also the light emission layer may contain a material which does not have a charge transporting property and does not emit light.

As the light emitting material usable in the invention, another fluorescence or phosphorescence emitting material may be used in addition to the interlocked material of the invention. Such light emitting material to be used in combination may be a low molecular compound or a high molecular compound.

The light-emitting layer may be composed of either one layer or two or more layers wherein the respective layers may emit light of different colors from one another in the respective layers.

A light emitting material usable in the present invention may comprise the interlocked compound in the present invention, and also another a fluorescence luminescent material or a phosphorescence luminescent material. These compounds usable in a combination may be a low molecular weight compound or a high molecular weight compound.

Examples of the fluorescence luminescent material, usable in the invention, include a benzofuran derivative, a benzothiophene derivative, a pyran derivative, a benzoxazole derivative, a benzimidazole derivative, a benzothiazole derivative, a styrylbenzene derivative, a polyphenyl derivative, a diphenylbutadiene derivative, a tetraphenylbutadiene derivative, a naphthylimide derivative, a coumarine derivative, a condensed-ring aromatic compound, a perylene derivative, an oxadiazole derivative, an oxazine derivative, an aldazine derivative, a pyrazine derivative, a cyclopentadiene derivative, a bisstyrylanthracene derivative, a quinacridone derivative, a pyrrolopyridine derivative, a thiadiazolopyridine derivative, a cyclopentadiene derivative, a styrylamine derivative, a diketopyrrolopyrrole derivative, an aromatic dimethylidin derivative, various metal complexes as typically represented by a metal complex of an 8-quinolinol derivative or a metal complex of a pyrromethene derivative, polymer compounds such as polythiophene, polyphenylene and polyphenylenevinylene, an organic silane derivative and the like.

Examples of the phosphorescence luminescent material usable in the present invention include complexes containing transition metal atoms or lantanoid atoms.

For instance, although the transition metal atoms are not limited, they are preferably ruthenium, rhodium, palladium, tungsten, rhenium, osmium, iridium, or platinum; more preferably rhenium, iridium, and platinum, or even more preferably iridium, or platinum.

Examples of the lantanoid atoms include lanthanum, cerium, praseodymium, neodymium, samarium, europium, gadolinium, terbium, dysprosium, holmium, erbium, thulium, ytterbium, and lutetium, and among these lantanoid atoms, neodymium, europium, and gadolinium are preferred.

Examples of ligands in the complex include the ligands described, for example, in "Comprehensive Coordination Chemistry" authored by G Wilkinson et al., published by Pergamon Press Company in 1987; "Photochemistry and Photophysics of Coordination compounds" authored by H. Yersin, published by Springer-Verlag Company in 1987; and "YUHKI KINZOKU KAGAKU—KISO TO OUYOU—(Metalorganic Chemistry—Fundamental and Application—)" authored by Akio Yamamoto, published by Shokabo Publishing Co., Ltd. in 1982.

Specific examples of the ligands include preferably halogen ligands (preferably chlorine ligands), aromatic ligands (e.g., cyclopentadienyl anions, benzene anions, or naphthyl anions and the like), nitrogen-containing heterocyclic ligands (e.g., phenylpyridine, benzoquinoline, quinolinol, bipyridyl, or phenanthroline and the like), diketone ligands (e.g., acetylacetone and the like), carboxylic acid ligands (e.g., acetic acid ligands and the like), alcoholate ligands (e.g., phenolate ligands and the like), carbon monoxide ligands, isonitryl ligands, and cyano ligand, and more preferably nitrogen-containing heterocyclic ligands.

The above-described complexes may be either a complex containing one transition metal atom in the compound, or a so-called polynuclear complex containing two or more transition metal atoms wherein different metal atoms may be contained at the same time.

The phosphorescence luminescent material is contained in an amount of 0.1% by mass to 40% by mass in the light-emitting layer, but it is preferably contained in an amount of 0.5% by mass to 20% by mass.

Also examples of the host material to be contained in the light emission layer of the invention include compounds having a pyrrole skeleton, compounds having an indole skeleton, compounds having a carbazole skeleton, compounds having an diarylamine skeleton, compounds having a pyridine skeleton, compounds having a pyrazine skeleton, compounds having a triazine skeleton, compounds having an arylsilane skeleton, and materials cited as examples in the hole injection layer, hole transport layer, electron injection layer and electron transport layer to be explained later.

Although a thickness of the light-emitting layer is not particularly limited, 1 nm to 500 nm is usually preferred, and within this range, 5 nm to 200 nm is more preferable, and 10 nm to 100 nm is further preferred.

—Positive Hole-Injection Layer and Positive Hole-Transport Layer—

The positive hole-injection layer and positive hole-transport layer correspond to layers functioning to receive positive holes from an anode or from an anode side and to transport the positive holes to a cathode side. As a material for the positive hole-injection layer and positive hole-transport layer usable in the invention, other positive hole-injection material and positive hole-transport material may be used in addition to the interlocked material of the invention. Such positive hole-injection material or a positive hole-transport material may be a low molecular compound or a high molecular compound.

Specific examples of the positive hole-injection layer and the positive hole-transport layer, preferably include a layer containing pyrrole derivatives, carbazole derivatives, pyrazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted calcon derivatives, styrylanthracene derivatives, fluorenone derivatives, hydrazone derivatives, stilbene derivatives, silazane derivatives, aromatic tertiary amine compounds, styrylamine derivatives, aromatic dimethylidine compounds, phthalocyanine compounds, porphyrin compounds, thiophene derivatives, organosilane derivatives, carbon or the like.

An electron-accepting dopant may be introduced into a positive hole-injection layer or a positive hole-transport layer in the organic electroluminescence device of the present invention. As the electron-accepting dopant to be introduced into a positive hole-injection layer or a positive hole-transport layer, either of an inorganic compound or an organic compound may be used as long as the compound has electron accepting property and a function for oxidizing an organic compound.

Specifically, the inorganic compound includes metal halides, such as ferric chloride, aluminum chloride, gallium chloride, indium chloride and antimony pentachloride and the like, and metal oxides, such as vanadium pentoxide, molybdenum trioxide and the like.

In case of the organic compounds, compounds having substituents such as a nitro group, a halogen, a cyano group, a trifluoromethyl group and the like; quinone compounds; acid anhydride compounds; fullerenes; and the like may be preferably applied.

Another specific examples thereof include compounds described in patent documents such as JP-A Nos. 6-212153, 11-111463, 11-251067. 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, 2005-209643 and the like.

These electron-accepting dopants may be used alone or in a combination of two or more of them. Although an applied amount of these electron-accepting dopants depends on the type of material, 0.01% by mass to 50% by mass of a dopant is preferred with respect to a positive hole-transport layer material, 0.05% by mass to 20% by mass is more preferable, and 0.1% by mass to 10% by mass is particularly preferred.

A thickness of the positive hole-injection layer and the positive hole-transport layer is preferably 500 nm or less, respectively in view of decreasing driving voltage.

The thickness of the positive hole-transport layer is preferably 1 nm to 500 nm, more preferably is 5 nm to 200 nm, and most preferably is 10 nm to 100 nm.

The thickness of the positive hole-injection layer is preferably 0.1 nm to 200 nm, more preferably is 0.5 nm to 100 nm, and most preferably is 1 nm to 100 nm.

The positive hole-injection layer and the positive hole-transport layer may be composed of a monolayered structure comprising one or two or more of the above-mentioned materials, or a multilayer structure composed of plural layers of a homogeneous composition or heterogeneous compositions.

—Electron Injection Layer and Electron-Transport Layer—

The electron injection layer and the electron-transport layer are layers having any of functions for injecting electrons from the cathode, transporting electrons, and becoming a barrier to positive holes which could be injected from the anode. As a material for the electron injection layer and the electron-transport layer usable in the invention, other electron-injection material and electron-transport material may be used in addition to the interlocked material of the invention. Such electron-injection materials or electron-transport materials may be a low molecular compound or a high molecular compound.

Specifically, these layers are preferably those containing a pyridine derivative, a quinoline derivative, a pyrimidine derivative, a pyrazine derivative, a phthalazine derivative, a phenanthroline derivative, a triazine derivative, a triazole derivative, an oxazole derivative, an oxadiazole derivative, an imidazole derivative, a fluorenone derivative, an anthraquinodimethane derivative, an anthrone derivative, a diphenylquinone derivative, a thiopyran dioxide derivative, a carbodiimide derivative, a fluorenylidenemethane derivative, a distyrylpyrazine derivative, a tetracarboxylic anhydride of an aromatic compound such as naphthalene or perylene, a phthalocyanine derivative, various metal complexes as typically represented by a metal complex of a 8-quinolinol derivative or metallophthalocyanine, a metal complex containing benzoxazole or benzothiazole as a ligand, or an organic silane derivative typically represented by silole.

In the organic EL device of the invention, an electron donating dopant may be contained in the electron injection layer or the electron transport layer. As a material applied for the electron-donating dopant with respect to the electron injection layer or the electron-transport layer, any material may be used as long as it has an electron-donating property and a property for reducing an organic compound, and alkaline metals such as Li, alkaline earth metals such as Mg, and transition metals including rare-earth metals are preferably used. Particularly, metals having a work function of 4.2 V or less are preferably applied, and specific examples thereof include Li, Na, K, Be, Mg, Ca, Sr, Ba, Y, Cs, La, Sm, Gd, and Yb. Also examples of the organic reducing compound include a nitrogen-containing compound, a sulfur-containing compound and a phosphorus-containing compound.

In addition, there may be utilized materials described in JP-A Nos. 6-212153, 2000-196140, 2003-68468, 2003-229278 and 2004-342614.

These electron-donating dopants may be used alone or in a combination of two or more of them.

An applied amount of the electron-donating dopants differs dependent on the types of the materials, but it is preferably 0.1% by mass to 99% by mass with respect to an electron-transport layer material, more preferably 1.0% by mass to 80% by mass, and particularly preferably 2.0% by mass to 70% by mass.

A thickness of the electron injection layer and the electron-transport layer is preferably 500 nm or less, respectively in view of decreasing driving voltage. The thickness of the electron-transport layer is preferably 1 nm to 500 nm, more preferably is 5 nm to 200 nm, and particularly preferably is 10 nm to 100 nm. The thickness of the electron-injection layer is preferably 0.1 nm to 200 nm, more preferably is 0.2 nm to 100 nm, and particularly preferably is 0.5 nm to 50 nm.

The electron injection layer and the electron-transport layer may have either a monolayered structure comprising one or two or more of the above-mentioned materials, or a multilayer structure composed of plural layers of a homogeneous composition or a heterogeneous composition.

—Positive Hole-Blocking Layer—

A positive hole-blocking layer is a layer having a function to prevent the positive holes transported from the anode to the light-emitting layer from passing through to the cathode side. According to the present invention, a positive hole-blocking layer may be provided as an organic compound layer adjacent to the light-emitting layer on the cathode side.

The positive hole-blocking layer is not particularly limited, but specifically, it may contain an aluminum complex such as BAlq, a triazole derivative, a phenanthroline derivative such as BCP, or the like.

It is preferred that a thickness of the positive hole-blocking layer is preferably 1 nm to 500 nm, more preferably it is 5 nm to 200 nm, and further preferably it is 10 nm to 100 nm.

The positive hole-blocking layer may have either a monolayered structure comprising one or two or more of the above-mentioned materials, or a multilayer structure composed of plural layers of a homogeneous composition or a heterogeneous composition.

—Electron-Blocking Layer—

A electron-blocking layer is a layer having a function to prevent the electron transported from the cathode to the light-emitting layer from passing through to the anode side. According to the present invention, a electron-blocking layer may be provided as an organic compound layer adjacent to the light-emitting layer on the anode side.

Specific examples of the electron-blocking layer include compounds explained above as a positive hole-transporting material.

It is preferred that a thickness of the electron-blocking layer is preferably 1 nm to 500 nm, more preferably it is 5 nm to 200 nm, and further preferably it is 10 nm to 100 nm.

The electron-blocking layer may have either a monolayered structure comprising one or two or more of the above-mentioned materials, or a multilayer structure composed of plural layers of a homogeneous composition or a heterogeneous composition.

(Protective Layer)

According to the present invention, the whole organic EL device may be protected by a protective layer.

A material contained in the protective layer may be one having a function to prevent penetration of substances such as moisture and oxygen, which accelerate deterioration of the device, into the device.

Specific examples thereof include metals such as In, Sn, Pb, Au, Cu, Ag, Al, Ti, Ni and the like; metal oxides such as MgO, SiO, $SiO_2$, $Al_2O_3$, GeO, NiO, CaO, BaO, $Fe_2O_3$, $Y_2O_3$, $TiO_2$ and the like; metal nitrides such as $SiN_x$, $SiN_xO_y$ and the like; metal fluorides such as $MgF_2$, LiF, $AlF_3$, $CaF_2$ and the like; polyethylene; polypropylene; polymethylmethacrylate; polyimide; polyurea; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

(Sealing)

The whole organic electroluminescence device of the present invention may be sealed with a sealing cap.

Furthermore, a moisture absorbent or an inert liquid may be used to seal a space defined between the sealing cap and the luminescent device. Although the moisture absorbent is not particularly limited. Specific examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, magnesium oxide and the like. Although the inert liquid is not particularly limited, specific examples thereof include paraffins; liquid paraffins; fluorine-based solvents such as perfluoroalkanes, perfluoroamines, perfluoroethers and the like; chlorine-based solvents; silicone oils; and the like.

(Driving Device)

In the organic electroluminescence device of the present invention, when a DC (AC components may be contained as needed) voltage (usually 2 volts to 15 volts) or DC is applied across the anode and the cathode, luminescence can be obtained.

For the driving method of the organic electroluminescence device of the present invention, driving methods described in JP-A Nos. 2-148687, 6-301355, 5-29080, 7-134558, 8-234685, and 8-241047; Japanese Patent No. 2784615, U.S. Pat. Nos. 5,828,429 and 6,023,308 are applicable.

In the organic EL device of the present invention, the light-extraction efficiency can be improved by various known methods. It is possible to elevate the light-extraction efficiency and to improve the external quantum efficiency, for example, by modifying the surface shape of the substrate (for example by forming fine irregularity pattern), by controlling the refractive index of the substrate, the ITO layer and/or the organic layer, or by controlling the thickness of the substrate, the ITO layer and/or the organic layer.

The organic electroluminescence device of the present invention may have a so-called op-emission configuration in which the light emission is extracted from the anode side.

(Application of the Organic Electroluminescence Device of the Present Invention)

The organic electroluminescence device of the present invention can be appropriately used for indicating elements, displays, backlights, electronic photographs, illumination light sources, recording light sources, exposure light sources, reading light sources, signages, advertising displays, interior accessories, optical communications and the like.

EXAMPLES

The present invention will be further clarified by way of examples, but the present invention is not limited to such examples.

Example 1

Preparation of Organic EL Device (Preparation of Organic EL Device No. 1 of the Invention)
1) Formation of Anode A 25 mm×25 mm×0.7 mm glass substrate, on which ITO was deposited with a thickness of 150 nm (manufactured by Tokyo Sanyo Vacuum Industries Co.) was used as a transparent substrate. The transparent substrate was subjected to etching and washing.

2) Hole Injection/Transport Layer

On this ITO glass substrate, Baytron P (PEDOT-PSS solution (polyethylenedioxythiophene-polystyrenesulfonic acid dopant); manufactured by Bayer AG) was spin coated and vacuum dried to obtain a hole injection/transport layer (film thickness: about 100 nm).

3) Light Emission Layer

On the hole injection/transport layer, a solution, formed by dissolving 3 mg of the interlocked compound No. 17 as the light emitting material and 40 mg of polyvinylcarbazole as the host material in 3.5 g of 1,2-dichloroethane and containing the light emitting material in an amount of about 0.08% by mass, was spin coated and vacuum dried. The film thickness was about 40 nm.

4) Electron Transport Layer

Next, electron transport materials BAlq and Alq were deposited in succession to obtain respective film thicknesses of 20 nm (evaporation rate: 0.15 nm/sec) and 30 nm (deposition rate: 0.1 nm/sec), thereby obtaining an electron transport layer.

5) Electron Injection Layer

Further, LiF was deposited with a thickness of about 1 nm (deposition rate: 0.01 nm/sec).

6) Formation of Cathode Electrode

A patterned mask (mask providing a light emission area of 2 mm×2 mm) was provided thereon, and aluminum was deposited with a thickness of about 70 nm (deposition rate: 0.3 nm/sec) to obtain a device. The prepared device was sealed in a dry glove box.

The deposition operations above were executed in a vacuum of $10^{-3}$ to $10^{-4}$ Pa, with a substrate temperature at room temperature.

(Preparation of Organic EL Device No. 2 of the Invention)

An organic EL device No. 2 was prepared in a similar manner as in the preparation of the organic EL device No. 1 of the invention, except that, in the preparation, the interlocked compound No. 17 in the light emission layer was replaced by the interlocked compound No. 22.

(Preparation of Organic EL Device No. 3 of the Invention)

An organic EL device No. 3 was prepared in a similar manner as in the preparation of the organic EL device No. 1 of the invention, except that, in the preparation, the interlocked compound No. 17 in the light emission layer was replaced by the interlocked compound No. 30.

(Preparation of Organic EL Device No. 4 of the Invention)

An organic EL device 4 was prepared in a similar manner as in the preparation of the organic EL device No. 1 of the invention, except that, in the preparation, the interlocked compound No. 17 in the light emission layer was replaced by the interlocked compound No. 34.

(Preparation of Comparative Organic EL Device No. A)

A comparative organic EL device No. A was prepared in a similar manner as in the preparation of the organic EL device No. 1 of the invention, except that, in the preparation, the interlocked compound No. 17 in the light emission layer was replaced by Ir(ppy)$_3$.

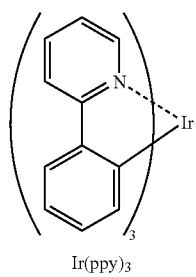

Ir(ppy)$_3$ (Preparation of Comparative Organic EL Device No. B)

A comparative organic EL device No. B was prepared in a similar manner as in the preparation of the organic EL device No. 1 of the invention, except that, in the preparation, the interlocked compound No. 17 in the light emission layer was replaced by a compound P-A (compound described in JP-A No. 2003-77675).

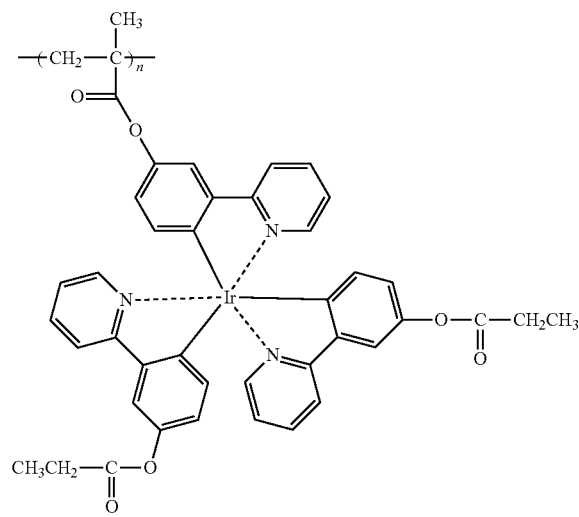

P-A (Preparation of Comparative Organic EL Device No. C)

A comparative organic EL device No. C was prepared in a similar manner as in the preparation of the organic EL device No. 1 of the invention, except that, in the preparation, the interlocked compound No. 17 in the light emission layer was replaced by a compound P-B (compound described in JP-A No. 2003-77675).

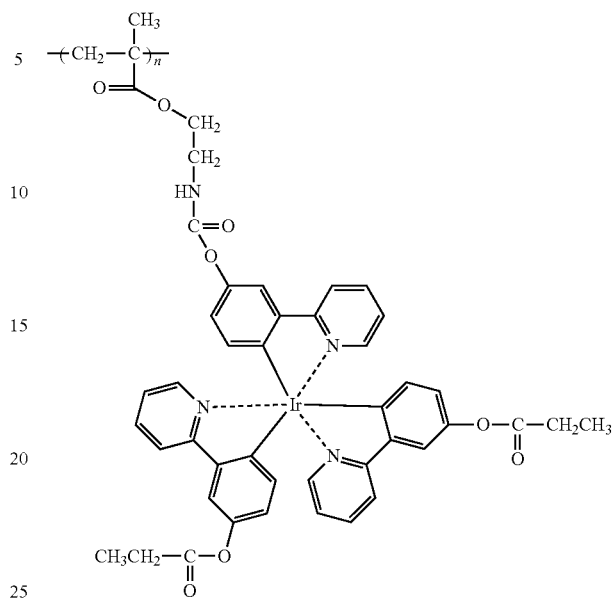

P-B

<Evaluation of Performance of Organic EL Device>

1) External Quantum Efficiency

A DC voltage was applied, using a Source Measure Unit 2400 manufactured by Toyo TECHNICA Corp., to each device to thereby cause light emission. The luminance was measured using a luminance meter BM-8 manufacture to Topcon Corp. A light emission spectrum and a light emission wavelength were measured using a Spectrum Analyzer PMA-11, manufactured by Hamamatsu Photonics K.K. Based on these values, an external quantum efficiency at a luminance of 1000 cd/m$^2$ was calculated by a luminance conversion method.

2) Maximum Luminance

A DC voltage was applied, using a Source Measure Unit 2400 manufactured by Toyo TECHNICA Corp., to each device to thereby cause light emission. The current supplied to the device was gradually, increased, and a luminance immediately before device destruction was measured as a maximum luminance.

3) Driving Durability: Half-Life Period of Luminance

A DC voltage was applied to each device so as to obtain a luminance of 1000 cd/m$^2$, and a time until the luminance was reduced to 500 cd/m$^2$ (half-life period of luminance) was measured. The half-life period of luminance was used as an index for the driving durability.

4) Storage Stability of Organic EL Device after Manufacture

A luminance of the device, when driven with a current density of 10 mA/cm$^2$ immediately after the manufacture, was designated as 100, and the storage stability was evaluated by a relative value of the luminance measured after the device was stored at 75° C. for 24 hours.

The obtained results are summarized in Table 1.

TABLE 1

| Device No. | Emission Color | Maximum Luminance | External Quantum Efficiency (%) | Half-life Period of Luminance (h) | Storage Stability | Remarks |
|---|---|---|---|---|---|---|
| Inventive Device No. 1 | Green | 152000 cd/m$^2$ | 6.10 | 800 | 60 | Invention |
| Inventive Device No. 2 | Green | 180000 cd/m$^2$ | 6.80 | 850 | 62 | Invention |
| Inventive Device No. 3 | Green | 220000 cd/m$^2$ | 7.20 | 900 | 65 | Invention |
| Inventive Device No. 4 | Green | 260000 cd/m$^2$ | 8.10 | 1100 | 70 | Invention |
| Comparative Device No. A | Green | 52000 cd/m$^2$ | 4.80 | 150 | 25 | Comparative |
| Comparative Sample No. B | Green | 34000 cd/m$^2$ | 3.20 | 210 | 36 | Comparative |
| Comparative Device No. C | Green | 28000 cd/m$^2$ | 2.70 | 180 | 33 | Comparative |

As will be apparent from the above-described results, the devices of the present invention, in comparison with the comparative devices, exhibited a higher maximum luminance, were superior in light emission efficiency and in driving durability, and exhibited little deterioration in performance after device manufacturing, thus being excellent in the storage stability.

Example 2

Preparation of Device

Samples were prepared by changing the concentration of the light emitting material, in the light emission layer in each of the device No. 3 of the invention and the comparative device No. A of Example 1, as shown in Table 2.

<Evaluation of Performance>

Results by evaluations in a similar manner as in the evaluation of Example 1 are shown in Table 2.

TABLE 2

| Device No. | Light Emitting Material | Concentration (% by mass) | Emission Colr | Maximum Luminance | External Quantum Efficiency (%) | Half-life Period of Luminance (h) | Remarks |
|---|---|---|---|---|---|---|---|
| 2-1 | Compound No. 30 of Invention | 0.08 | Green | 220000 cd/m$^2$ | 7.20 | 900 | Invention |
| 2-2 | Compound No. 30 of Invention | 2.00 | Green | 245000 cd/m$^2$ | 8.30 | 1100 | Invention |
| 2-3 | Compound No. 30 of Invention | 5.00 | Green | 290000 cd/m$^2$ | 9.60 | 1200 | Invention |
| 2-4 | Compound No. 30 of Invention | 10.00 | Green | 330000 cd/m$^2$ | 10.30 | 1400 | Invention |
| 2-5 | Ir(ppy)$_3$ | 0.08 | Green | 52000 cd/m$^2$ | 4.80 | 150 | Comparative |
| 2-6 | Ir(ppy)$_3$ | 2.00 | Green | 68000 cd/m$^2$ | 5.20 | 140 | Comparative |
| 2-7 | Ir(ppy)$_3$ | 5.00 | Green | 41000 cd/m$^2$ | 3.30 | 100 | Comparative |
| 2-8 | Ir(ppy)$_3$ | 10.00 | Yellowish green | 29000 cd/m$^2$ | 1.20 | 30 | Comparative |

In the comparative devices, an increase in the concentration of Ir(ppy)$_3$ provided only slight increases in maximum luminance and in external quantum efficiency, but maximum luminance and external quantum efficiency rather showed a decreasing tendency at a higher concentration of Ir(ppy)$_3$. Also, at a high concentration thereof, color of light emission showed a change to yellow-green color. Also, in a device No. 2-8 containing Ir(Ppy)$_3$ at a high concentration, light-emitting plane showed unevenness in striped shape.

On the other hand, the devices of the invention showed increases in maximum luminance and external quantum efficiency and also in durability, with an increase in the concentration of the interlocked compound. Also, color of light emission showed scarcely any change. Also, in a device No. 2-4 in which the interlocked compound No. 30 was coated by a high concentration solution of 10% by mass, the light-emitting plane was uniform, indicating that an excellent performance could be obtained in a device prepared by wet coating process.

The change in color of light emission (to a longer wavelength) at a high concentration of Ir(ppy)$_3$ is estimated to be attributed to a molecular association, while the interlocked compound employed in the invention is estimated to be dispersed in monomer-like manner in the unit of each molecule even when coated at a high concentration, thereby not causing a change in the color of light emission.

Example 3

Preparation of Organic EL Device (Preparation of Organic EL Device No. 3-1 of the Invention)

1) Formation of Anode

A 25 mm×25 mm×0.7 mm glass substrate, on which ITO was deposited with a thickness of 150 nm (manufactured by Tokyo Sanyo Vacuum Industries Co.) was used as a transparent substrate. The transparent substrate was subjected to etching and washing.

2) Hole Injection Layer

On this ITO glass substrate, a solution, formed by dissolving the interlocked compound No. 2 (20 mg) in 3.5 g of 1,2-dichloroethane (about 0.57% by mass solution) was spin coated and vacuum dried (film thickness: about 10 nm).

3) Hole Transport Layer

On the hole injection layer, α-NPD ((N,N'-di-α-naphthyl-N,N'-diphenyl)-benzidine) was so deposited as to obtain a film thickness of 30 nm (deposition rate: 0.1 nm/sec).

4) Light Emission Layer

On the hole transport layer, Ir(ppy)$_3$ as the light emitting material and CBP as the host material were so deposited with a ratio (by mass ratio) of 1:12 as to obtain a film thickness of 36 nm (deposition rate: 0.02 nm/sec for Ir(ppy)$_3$ and 0.24 nm/sec for CBP).

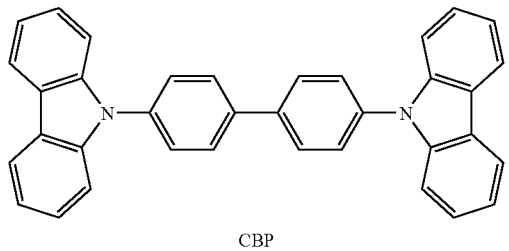

CBP

5) Electron Transport Layer

Then electron transport materials BAlq and Alq were deposited in succession to obtain respective film thicknesses of 20 nm (deposition rate: 0.15 nm/sec) and 30 nm (deposition rate: 0.1 nm/sec) thereby obtaining an electron transport layer.

6) Electron Injection Layer

Further, LiF was deposited with a thickness of about 1 nm (deposition rate: 0.01 nm/sec).

7) Formation of Cathode Electrode

A patterned mask (mask providing a light emission area of 2 mm×2 mm) was provided thereon, and aluminum was deposited with a thickness of about 70 nm (deposition rate: 0.3 nm/sec) to obtain a device. The prepared device was sealed in a dry glove box.

The deposition operations above were executed in vacuum of $10^{-3}$ to $10^{-4}$ Pa, with a substrate temperature at the room temperature.

(Preparation of Comparative Organic EL Device No. 3-2)

A comparative organic EL device No. 3-2 was prepared in a similar manner as in the preparation of the organic EL device No. 3-1 of the invention, except that the interlocked compound No. 2 in the hole injection layer was replaced by 20 mg of copper phthalocyanine.

In this case, the coating liquid of the hole injection layer was scarcely dissolved and it was coated in a suspended state.

(Preparation of Comparative Organic EL Device No. 3-3)

A comparative organic EL device No. 3-3 was prepared in a similar manner as in the preparation of the organic EL device No. 3-1 of the invention, except that the interlocked compound No. 2 in the hole injection layer was replaced by 20 mg of m-MTDATA (an arylamine compound).

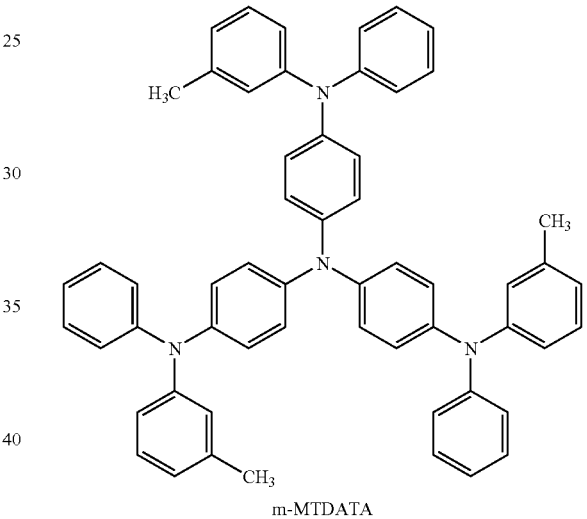

m-MTDATA

<Evaluation of Performance of Organic EL Device>

Evaluations were made with respect to the external quantum efficiency, the driving durability and the storability in a similar manner as in the evaluation of Example 1.

Obtained results are summarized in Table 3.

TABLE 3

| Device No. | Luminance Color | External Quantum Efficiency (%) | Half-life Period of Luminance (h) | Storage Stability | Remarks |
|---|---|---|---|---|---|
| Inventive Device No. 3-1 | Green | 6.30 | 1200 | 60 | Invention |
| Comparative Device No. 3-2 | No Emission | — | — | — | Comparative |
| Comparative Device No. 3-3 | Green | 4.80 | 900 | 35 | Comparative |

As will be apparent from the above-described results, copper phthalocyanine had a low solubility in solvent, and did not emit any light. Also, the hole injection material m-MTDATA of arylamine type, though capable of being coated, was poor in storage stability. In contrast, the device of the invention was preparable by wet coating process, and was excellent in storage stability.

Example 4

Preparation of Organic EL Device (Preparation of Organic EL Device No. 4-1 of the Invention)
1) anode, and 2) hole injection/transport layer were prepared in a similar manner as in the preparation of Example 1.

3) Light Emission Layer

On the hole injection/transport layer, a solution formed by dissolving rubrene (8 mg) as the light emitting material, polyvinylcarbazole (30 mg) as the host material and the interlocked compound No. 35 (10 mg) as the electron transport material in 4.0 g of 1,2-dichloroethane was spin coated, and vacuum dried. The film thickness was about 40 nm.

4) Electron Transport Layer

Then electron transport materials BAlq and Alq were deposited in succession to obtain respective film thicknesses of 20 nm (deposition rate: 0.15 nm/sec) and 30 nm (deposition rate: 0.1 nm/sec) thereby obtaining an electron transport layer.

5) Electron Injection Layer

Further, LiF was deposited with a thickness of about 1 nm (deposition rate: 0.01 nm/sec).

6) Formation of Cathode Electrode

A patterned mask (mask providing a light emission area of 2 mm×2 mm) was provided thereon, and aluminum was deposited with a thickness of about 70 nm (deposition rate: 0.3 nm/sec) to obtain a device. The prepared device was sealed in a dry glove box.

The deposition operations above were executed in vacuum of $10^{-3}$ to $10^{-4}$ Pa, with a substrate temperature at the room temperature.

(Preparation of Comparative Organic EL Device No. 4-2)

A comparative organic EL device No. 4-2 was prepared in a similar manner as in the preparation of the organic EL device No. 4-1 of the invention, except that the interlocked compound No. 35 employed as the electron transport material in the light emission layer was replaced by Bphen (10 mg).

Bphen

<Evaluation of Performance of Organic EL Device>

Evaluations were made with respect to external quantum efficiency, driving durability and storability in a similar manner as in the evaluation of Example 1.

Obtained results are summarized in Table 4.

As will be apparent from the above-described results, the device of the present invention, in comparison with comparative device, was superior in light emission efficiency and in driving durability, and showed little deterioration of the performance after the device manufacturing, thus being excellent in storage stability.

What is claimed is:

1. An organic electroluminescence device comprising at least an organic layer between a pair of electrodes, wherein the organic electroluminescence device includes at least an interlocked compound,
   wherein the interlocked compound is a compound represented by one of the following formula (I), (II) or (III):

Formula (I)

wherein, in the formula (I), $M^1$ represents a metal; $L^{11}$, $L^{12}$, $L^{13}$ and $L^{14}$ each independently represent an atomic group coordinated to the metal; and $Y^{11}$ and $Y^{12}$ each independently represent a linking group;

Formula (II)

wherein, in the formula (II), $M^2$ represents a metal; $L^{21}$, $L^{22}$, $L^{23}$ and $L^{24}$ each independently represent an atomic group coordinated to the metal; and $Y^{21}$ and $Y^{22}$ each independently represent a linking group;

Formula (III)

wherein, in the formula (III), $M^3$ represents a metal; $L^{31}$, $L^{32}$, $L^{33}$, $L^{34}$, $L^{35}$ and $L^{36}$ each independently represent an atomic group coordinated to the metal; and $Y^{31}$ and $Y^{32}$ each independently represent a linking group, and
   wherein a layer containing the interlocked compound is a hole injection layer.

2. The organic electroluminescence device according to claim 1, wherein the layer containing the interlocked compound is formed by a wet coating process.

TABLE 4

| Device No. | Luminance Color | External Quantum Efficiency (%) | Half-life Period of Luminance (h) | Sotrage Stability | Remarks |
|---|---|---|---|---|---|
| Inventive Device No. 4-1 | Green | 7.30 | 1000 | 60 | Invention |
| Comparative Device No. 4-1 | Green | 5.10 | 110 | 12 | Comparative |

3. An organic electroluminescence device comprising at least an organic layer between a pair of electrodes, wherein the organic electroluminescence device includes at least an interlocked compound, wherein the interlocked compound is a compound represented by one of the following formula (I), (II) or (III):

Formula (I)

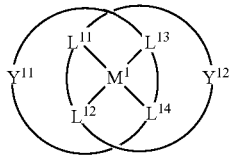

wherein, in the formula (I), $M^1$ represents a metal; $L^{11}$, $L^{12}$, $L^{13}$ and $L^{14}$ each independently represent an atomic group coordinated to the metal; and $Y^{11}$ and $Y^{12}$ each independently represent a linking group;

Formula (II)

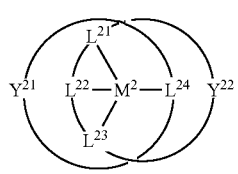

wherein, in the formula (II), $M^2$ represents a metal; $L^{21}$, $L^{22}$, $L^{23}$ and $L^{24}$ each independently represent an atomic group coordinated to the metal; and $Y^{21}$ and $Y^{22}$ each independently represent a linking group, Formula (III)

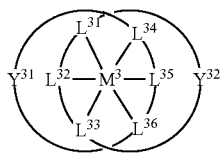

wherein, in the formula (III), $M^3$ represents a metal; $L^{31}$, $L^{32}$, $L^{33}$, $L^{34}$, $L^{35}$ and $L^{36}$ each independently represent an atomic group coordinated to the metal; and $Y^{31}$ and $Y^{32}$ each independently represent a linking group, and wherein a layer containing the interlocked compound is a hole injection layer and a light emission layer.

4. The organic electroluminescence device according to claim 1, wherein the interlocked compound is a compound represented by the following formula (I-A):

Formula (I-A)

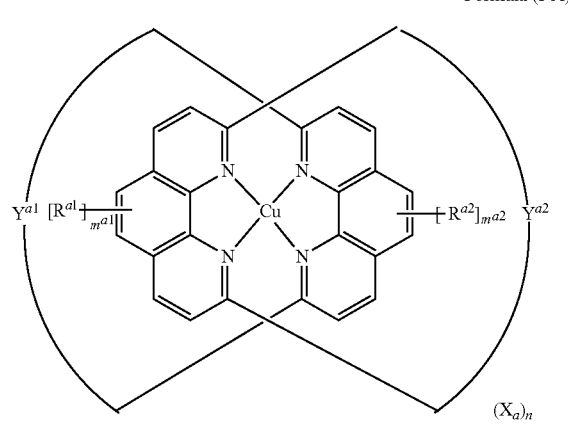

wherein, in the formula (I-A), $Y^{a1}$ and $Y^{a2}$ each independently represent a linking group; $R^{a1}$ and $R^{a2}$ each independently represent a substituent; $m^{a1}$ and $m^{a2}$ each independently represent an integer from 0 to 6; Xa represents an anion; and n represents a number equal to or larger than 0, determined so that the compound represented by the formula (I-A) becomes neutral.

5. The organic electroluminescence device according to claim 1, wherein the interlocked compound is a compound represented by the following formula (II-A):

Formula (II-A)

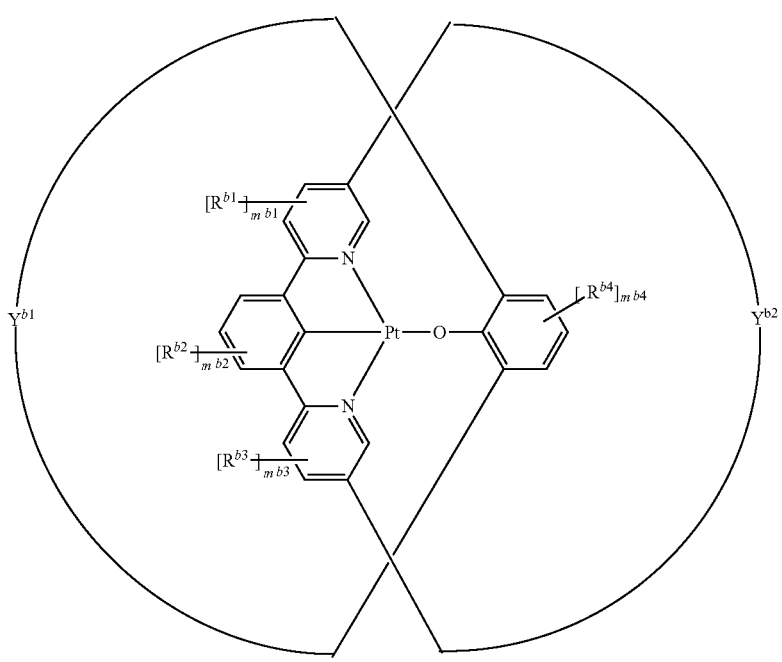

wherein, in the formula (II-A), $Y^{b1}$ and $Y^{b2}$ each independently represent a linking group; $R^{b1}$, $R^{b2}$, $R^{b3}$ and $R^{b4}$ each independently represent a substituent; and $m^{b1}$, $m^{b2}$, $m^{b3}$ and $m^{b4}$ each independently represent an integer from 0 to 3.

6. The organic electroluminescence device according to claim 1, wherein the interlocked compound is a compound represented by the following formula (III-A):

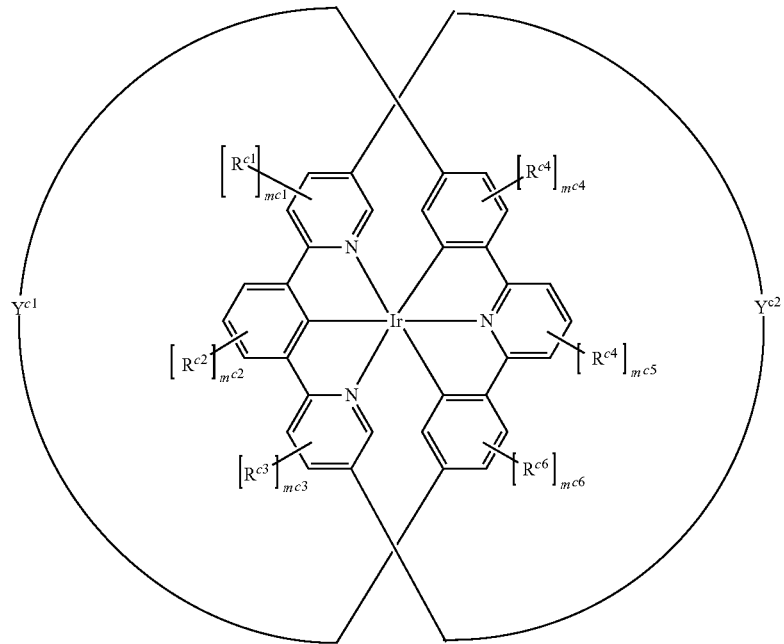

Formula (III-A)

wherein, in the formula (III-A), $Y^{c1}$ and $Y^{c2}$ each independently represent a linking group; $R^{c1}$, $R^{c2}$, $R^{c3}$, $R^{c4}$, $R^{c5}$ and $R^{c6}$ each independently represent a substituent; and $m^{c1}$, $m^{c2}$, $m^{c3}$, $m^{c4}$, $m^{c5}$ and $m^{c6}$ each independently represent an integer from 0 to 3.

* * * * *